US006589336B1

(12) United States Patent  
Ebara et al.

(10) Patent No.: US 6,589,336 B1
(45) Date of Patent: Jul. 8, 2003

(54) PRODUCTION METHOD FOR SILICON EPITAXIAL WAFER AND SILICON EPITAXIAL WAFER

(75) Inventors: Koji Ebara, Annaka (JP); Hiroki Ose, Annaka (JP); Yasuo Kasahara, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 20 days.

(21) Appl. No.: 09/889,020
(22) PCT Filed: Nov. 8, 2000
(86) PCT No.: PCT/JP00/07833
§ 371 (c)(1), (2), (4) Date: Jul. 10, 2001
(87) PCT Pub. No.: WO01/35452
PCT Pub. Date: May 17, 2001

(30) Foreign Application Priority Data

Nov. 10, 1999 (JP) ............................................ 11-319970

(51) Int. Cl.⁷ .............................................. C30B 25/22
(52) U.S. Cl. ............................ 117/94; 117/95; 117/101; 117/105; 117/89; 117/935
(58) Field of Search ............................ 117/94, 95, 101, 117/105, 89, 935

(56) References Cited

U.S. PATENT DOCUMENTS 5,070,382 A    12/1991  Cambou
6,342,436 B1 *  1/2002  Takizawa .................... 438/473

FOREIGN PATENT DOCUMENTS

| EP | 0413 256 A2 | 2/1991 |
| JP | 53135571 | 11/1978 |
| JP | 57106046 | 7/1982 |
| JP | 57115822 | 7/1982 |
| JP | 57192017 | 11/1982 |
| JP | 63313861 | 12/1988 |
| JP | 1105557 | 4/1989 |
| JP | 2151022 | 6/1990 |
| JP | 3235326 | 10/1991 |
| JP | 4328846 | 11/1992 |
| JP | 9063956 | 3/1997 |

OTHER PUBLICATIONS

Japanese Patent Office, Japanese Patent Application, Publication No.: 9–63956, Publication Date: Mar. 7, 1997, Application No.: 7–240948, Application Date: Aug. 25, 1995, pp. 1–4.
Japanese Patent Office, Japanese Patent Application, Publication No.: 4–328846, Publication Date: Nov. 17, 1992, Application No.: 3–125416, Application Date: Apr. 27, 1991, pp. 263–266.
Japanese Patent Office, Japanese Patent Application, Publication No.: 3–235326, Publication Date: Oct. 21, 1991, Application No.: 2–31802, Application Date: Feb. 13, 1990, pp. 141–146.

(List continued on next page.)

Primary Examiner—Robert Kunemund
(74) Attorney, Agent, or Firm—Snider & Associates; Ronald R. Snider

(57) ABSTRACT

Performing the post-implantation annealing for recovering crystallinity in a hydrogen atmosphere can successfully suppress the surface roughening on the ion-implanted layers without pre-implantation oxidation. This allows omission of the pre-implantation oxidation and allows ion implantation using only a photoresist film as a mask in a method for producing an epitaxial wafer having buried ion-implanted layers. Since an intentional formation of an oxide film, including such pre-implantation oxidation, on an epitaxial layer is omitted, the number of repetition of the thermal history exerted to the buried ion-implanted layers can be reduced, which effectively suppresses lateral diffusion of implanted ions. Since the formation and removal of the oxide film is thus no more necessary, the number of process steps in the production of the epitaxial wafer can dramatically be reduced.

22 Claims, 26 Drawing Sheets

OTHER PUBLICATIONS

Japanese Patent Office, Japanese Patent Application, Publication No.: 3–88362, Publication Date: Apr. 12, 1991, Application No.: 2–215941, Application Date: Aug. 17, 1990, pp. 357–361.

Japanese Patent Office, Japanese Patent Application, Publication No.: 2–151022, Publication Date: Jun. 11, 1990, Application No.: 63–305208, Application Date: Dec. 1, 1988, pp. 107–110.

Japanese Patent Office, Japanese Patent Application, Publication No.: 1–105557, Publication Date: Apr. 24, 1989, Application No.: 62–262998, Application Date: Oct. 19, 1987, pp. 299–303.

Japanese Patent Office, Japanese Patent Application, Publication No.: 63–313861, Publication Date: Dec. 21, 1988, Application No.: 62–150557, Application Date: Jun. 17, 1987, pp. 341–343.

Japanese Patent Office, Japanese Patent Application, Publication No.: 57–192017, Publication Date: Nov. 26, 1982, Application No.: 56–77440, Application Date: May 21, 1981, pp. 83–85.

Japanese Patent Office, Japanese Patent Application, Publication No.: 57–115822, Publication Date: Jul. 19, 1982, Application No.: 56–1694, Application Date: Jan. 8, 1981, pp. 99–102.

Japanese Patent Office, Japanese Patent Application, Publication No.: 57–106046, Publication Date: Jul. 1, 1982, Application No.: 55–182335, Application Date: Dec. 23, 1980, pp. 177–182.

Japanese Patent Office, Japanese Patent Application, Publication No.: 53–135571, Publication Date: Nov. 27, 1978, Application No.: 52–49937, Application Date: May 2, 1977, pp. 473–477.

Japanese Patent Office, Japanese Patent Application, Publication No.: 48–71187, Publication Date: Sep. 26, 1973, Application No.: 46–104577, Application Date: Dec. 24, 1971, pp. 439–441.

* cited by examiner

H₂ atmosphere

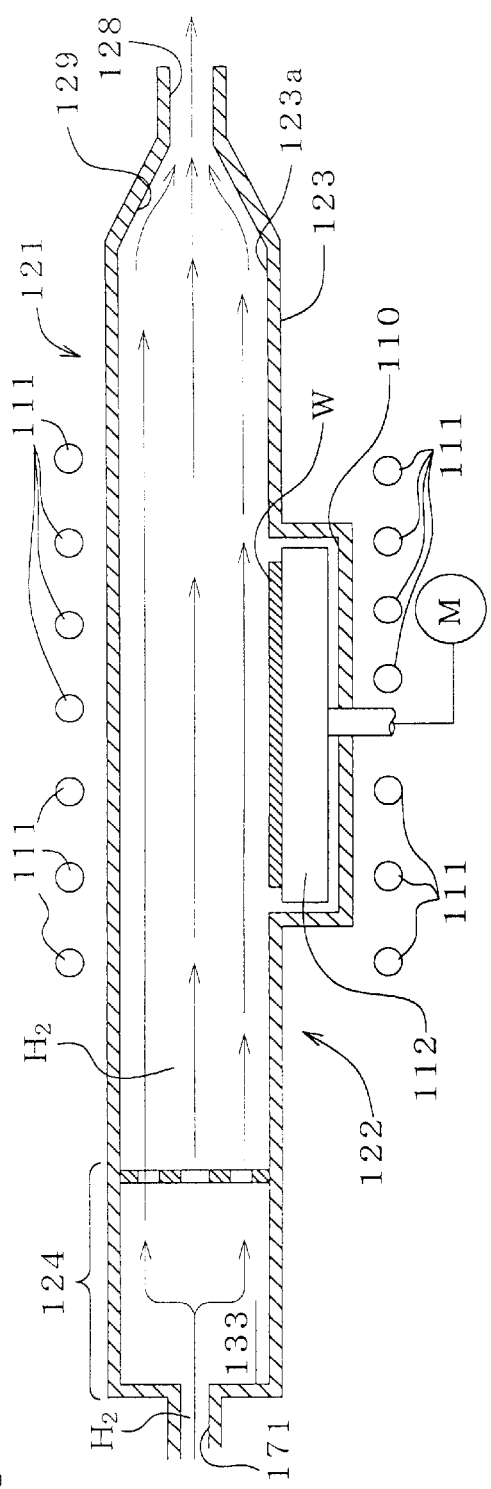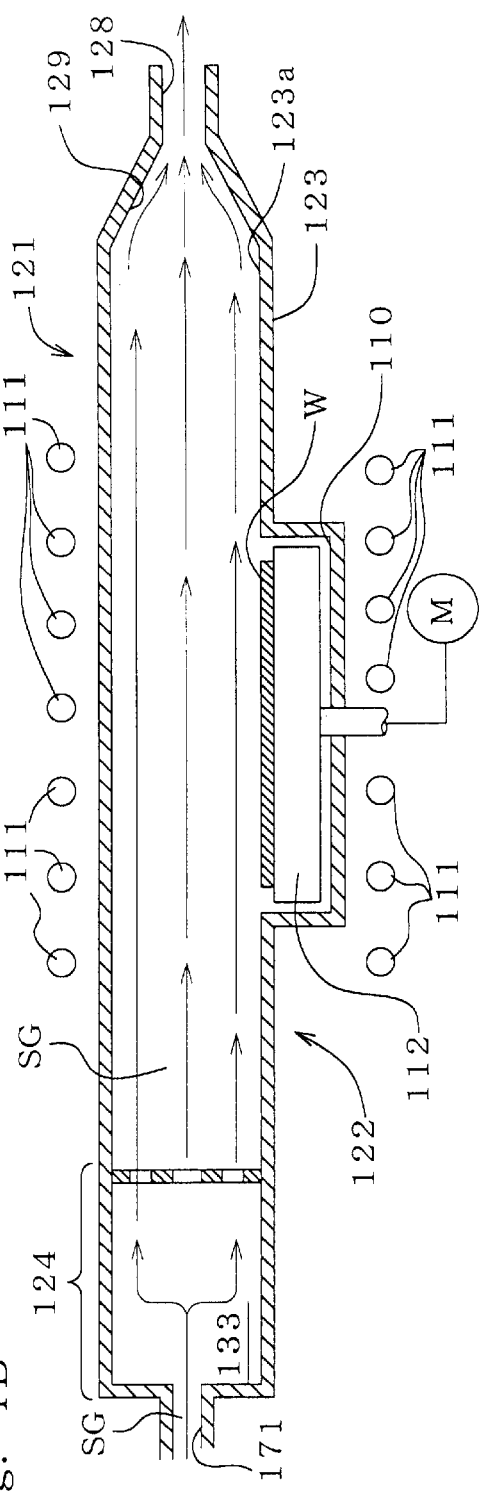

Buried ion-implanted layer

Vertical doped region $d < d'$ $d' \ll d''$

A—A

B-B

B component — 71

Fig. 28A
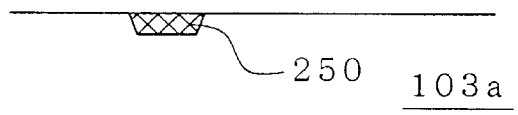
Fig. 28B
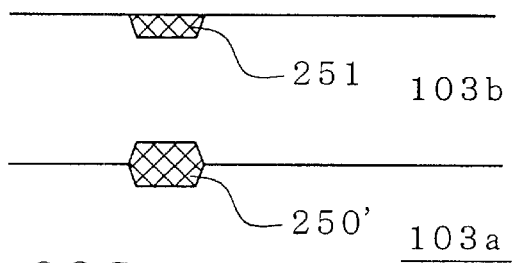
Fig. 28C
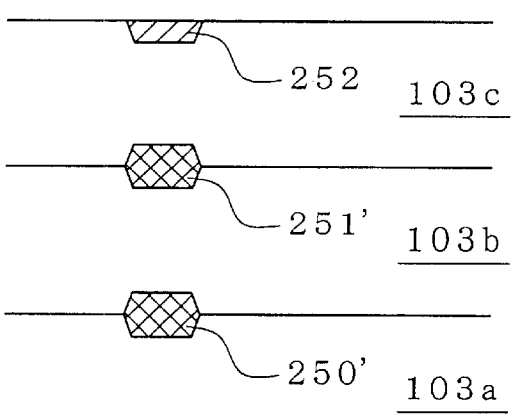
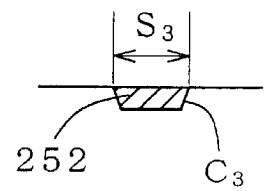
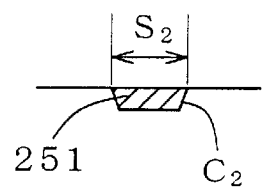
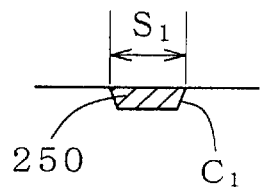
Fig. 28D
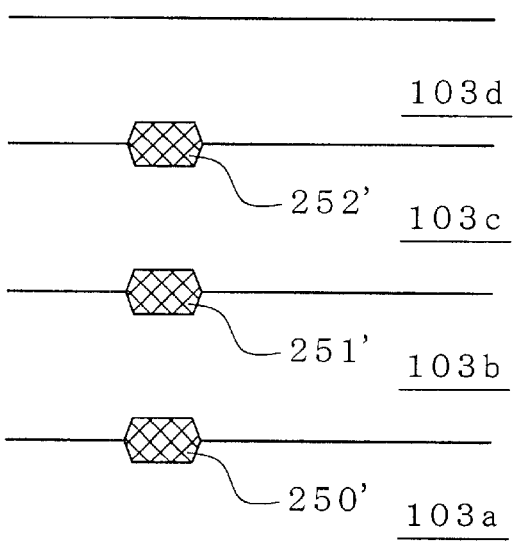
$S_1 < S_2 < S_3$
$C_1 > C_2 > C_3$

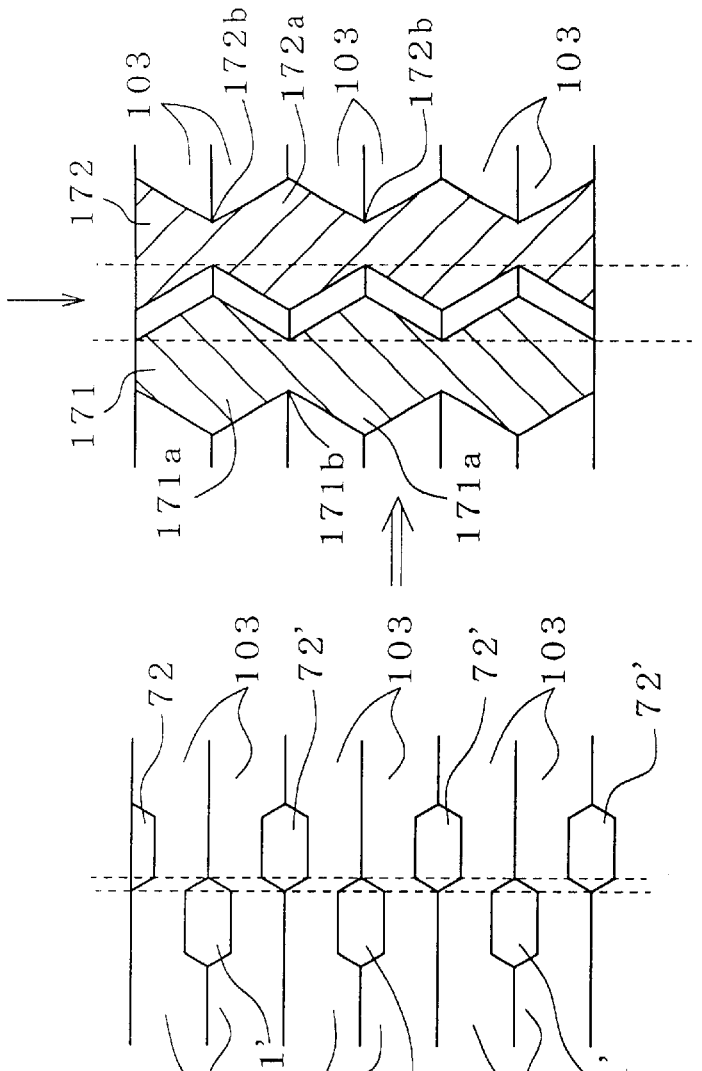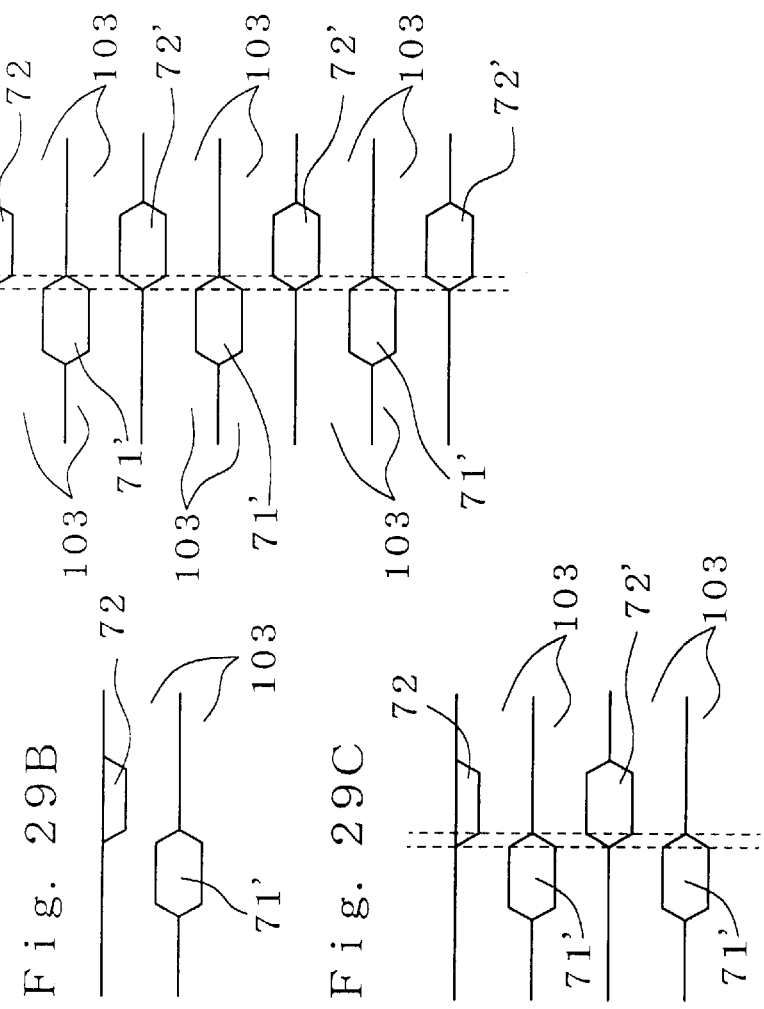

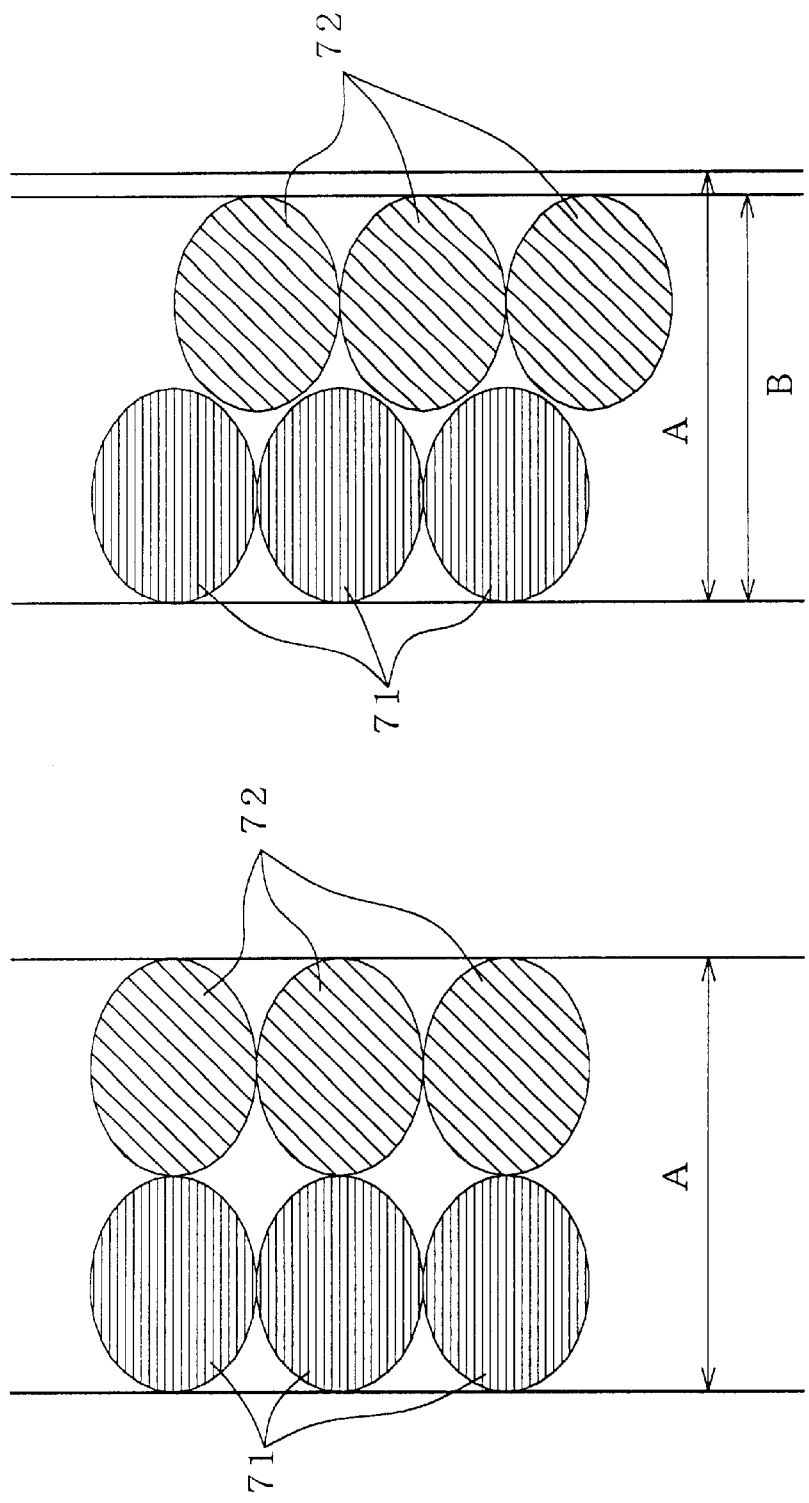

PRODUCTION METHOD FOR SILICON EPITAXIAL WAFER AND SILICON EPITAXIAL WAFER

FIELD OF THE INVENTION

The present invention relates to a method for producing silicon epitaxial wafer, and epitaxial wafer produced by such method; and in particular to a method for producing silicon epitaxial wafer in which a silicon epitaxial layer is ion-implanted and is then stacked with another silicon epitaxial layer by vapor-phase growth, to thereby form a buried layer, and epitaxial wafer produced by such method.

DESCRIPTION OF THE BACKGROUND ART

Japanese Laid-Open Patent Publication 1-105557 discloses a technique in which an impurity element is introduced by ion implantation into a silicon single-crystalline thin film (simply referred to as "silicon epitaxial layer", or more simply as "epitaxial layer" hereinafter) in a silicon epitaxial wafer (simply referred to as "epitaxial wafer" hereinafter) which comprises a silicon single-crystalline substrate and such epitaxial layer formed thereon by the vapor-phase epitaxial growth process. The above publication also discloses process steps for fabricating a CMOS circuit in such epitaxial wafer.

In the fabrication of a vertical MOSFET or vertical bipolar transistor in the epitaxial wafer, it is sometimes necessary to form an impurity doped region having a large depth (which is referred to as "vertical doped region" or "vertical impurity-doped region" hereinafter in this specification). Such "vertical doped region" is typified by a device isolation region for isolating a device from other region (device isolation regions 3, 4 in FIG. 1 of the above patent publication), and an impurity-doped region serving as a conduction route toward a high-density impurity diffused layer formed so as to be buried in the wafer (drain regions 6, 6a in FIG. 1 of the above patent publication).

For the case that the epitaxial layer is formed as a single layer having a relatively large thickness, it may be rather difficult to form a vertical doped region deep enough to penetrate the epitaxial layer only by a direct ion implantation. One technique for solving such problem is such that preliminarily forming an ion-implanted layer in the surface region of the substrate, growing thereon the epitaxial layer, forming another ion-implanted layer in the surface region of such epitaxial layer, and annealing the substrate so as to diffuse the doped impurity to thereby joint both ion-implanted layers produced by such ion implantations conducted twice. Such method is, however, still disadvantageous in terms of downsizing of the device for the case the vertical diffusion length is considerably large, since such case also requires a sufficient margin for the lateral diffusion. The foregoing patent publication also discloses a technique in which the formation process of a relatively thin epitaxial layer is repeated in plural times, rather than forming a single epitaxial layer which is relatively thick, where the individual formation processes of the epitaxial layers include doping of an impurity in a predetermined region, and perform annealing for diffusion so as to allow the individual impurity-doped regions to overlap with each other from the last epitaxial layer to a desired depth. It is described in the patent publication that such technique is advantageous in that the process only requires a short vertical diffusion length since the ion-implanted layer is provided to every epitaxial layer having a relatively small thickness, which successfully suppresses the lateral diffusion, and shortens the annealing time.

Now in the technique disclosed in the foregoing patent publication, an oxide film formed on the epitaxial layer is used as a mask (referred to as "ion implantation mask oxide film" hereinafter) for allowing selective implantation of impurity ion into a specific region in the epitaxial layer. Since the ion implantation mask is formed by thermal oxidation of the surface of the epitaxial layer, so that forming the ion-implanted layer into every epitaxial layer inevitably causes thermal history due to the oxide film formation in the number of repetition same with the number of the epitaxial layers (a first thermal history).

Annealing is also required after the ion implantation in order to recover crystal damage (referred to as "crystal recovery annealing" hereinafter), since crystal damage (defect) inevitably occurs due to the ion implantation effected at a high energy, so that the thermal history due to such annealing will be also added in the number of times same with the repetitive, number of the ion implantation (a second thermal history). In addition, if the surface in the pattern opening exposed after removal by etching of the ion implantation mask oxide film is directly implanted with ion and then annealed for crystal recovery (generally proceeded in an inert atmosphere such as in a nitrogen atmosphere), such surface tends to roughen due to such ion implantation as shown in FIG. 12A. Thus it is a general practice to form, prior to the ion implantation, a thin oxide film for preventing the surface roughening on the surface of the epitaxial layer exposed by the etching as shown in FIG. 12B (so-called pre-implantation oxidation). The formation of such oxide film is accomplished by thermal oxidation, which is again causative of thermal history in the number of times same with the repetitive number of the ion implantation (a third thermal history). Such ion-implanted layer is further stacked with another epitaxial layer grown thereon by the vapor-phase growth process to thereby form a buried layer, where high temperature during the process will be still again causative of thermal history in the number of times same with the repetitive number of epitaxial layers (a fourth thermal history).

Thus in the technique described in the foregoing patent publication, the ion-implanted layers are repetitively affected by four such types of thermal histories in each process cycle comprising the formation of the epitaxial layer and the ion implantation, so that the vertical doped region formed based on such ion-implanted layers cannot always be controlled in terms of diffusion in the lateral direction. For example, as shown in FIG. 6A, for the case that ion-implanted layers 101, 102 are formed between each adjacent epitaxial layers 103a to 103c, diffused regions 101a, 102a already expand to a considerable degree by the time that the formation of the epitaxial layers 103a to 103c and ion-implanted layers 101, 102 is completed due to multiple times of thermal history. If the annealing for diffusion is further proceeded to allow the individual ion-implanted layers 101, 102 to diffuse in the vertical direction and to joint with each other to thereby form a vertical doped region 105, the individual portions 105a, 105b corresponded to the ion-implanted layers 101, 102 will show a large lateral expansion. In particular, the lower ion-implanted layer 101 results in a larger lateral expansion as compared with the upper ion-implanted layer 102, since the former is affected by the repetitive thermal history with a larger number of times.

More specifically, as shown in FIG. 6C, an ion-implanted layer 101 will have a larger degree of the lateral expansion as the position thereof becomes lower, and the layers (in particular in the lower positions) will already be jointed to a certain degree due to the vertical diffusion by the time the top ion-implanted layer is formed. Thus the vertical doped region 105 obtained after the successive annealing will be only such that having a non-uniform width which grows toward the bottom as shown in FIG. 6D. For the case the ion-implanted layers of different conduction types (n-type and p-type, for example) have to be formed in the same epitaxial layer, it is necessary to repeat a process cycle, comprising the formation of the ion implantation mask oxide film, the pre-implantation oxidation and the crystal recovery annealing, for each conduction type, which will worsen the situation.

Another problem resides in the technique disclosed in Japanese Laid-Open Patent Publication 1-105557, in that the multiple repetition of the process cycle, comprising the formation of the ion implantation mask oxide film, the pre-implantation oxidation and the crystal recovery annealing, ruins the productivity due to a large number of the process steps. Beside the foregoing steps, actual process inevitably includes the derivative process steps listed below, which of course further worsen the problem of such low productivity:

(1) pre-oxidation cleaning is necessary before each formation process of the ion implantation mask oxide film in order to remove contaminants and produce a defect-free pattern;

(2) a mark for pattern alignment (so-called an alignment mark) is formed as a stepped or recessed pattern at the same time with the formation of the ion implantation mask, where such solid mark is newly formed each time the epitaxial layer is formed;

(3) a substrate for used in the production of an epitaxial wafer often has a backside oxide film made of silicon dioxide typically grown by the CVD process in order to prevent auto-doping from the side of the major back surface of such substrate. On the other hand on the side of the major front surface of the substrate, the formation and removal of the ion implantation mask oxide film are repeated in plural times on the epitaxial layers. The removal of the oxide film is generally effected by so-called wet etching in which the substrate is immersed into an etching solution such as hydrofluoric acid to thereby chemically dissolve the oxide film, where directly immersing the substrate into an etching solution will also undesirably remove a necessary back-side oxide film, so that it is a general practice to form a resist film on the backside oxide film in order to protect thereof. The resist film is, however, not durable at all to the annealing temperature during the formation of the ion implantation mask oxide film, so that it must be removed immediately after the wet etching and must be formed again each time the ion implantation mask oxide film is formed; and (4) pattern formation on the oxide layer is accomplished by photo-lithography, which is, as known well, include as much as three process steps of exposure of a photoresist, development and wet etching.

The vapor-phase growth of the epitaxial layer for forming the buried layer has a problem of auto-doping to be solved. That is, when the ion-implanted layer is formed, and the epitaxial layer is grown thereon in vapor-phase to thereby convert the ion-implanted layer into a buried layer, lateral auto-doping may sometimes occur from such ion-implanted layer. In such lateral auto-doping, a dopant element once released into the vapor phase is re-introduced into an epitaxial layer growing in the vicinity of the ion-implanted layer, so that even regions not subjected to the ion implantation may consequently be doped, which fails in obtaining target device properties at the interface of the epitaxial layers. A special care should be taken for the case that an n-type buried layer is produced by the ion implantation using, for example, phosphorus (P) which is most causative of the auto-doping.

Now another consideration will be made on the case in which a phosphorus-implanted layer is first formed as an n-type ion implanted layer and a p-type ion-implanted layer is then formed by implanting boron (B). The foregoing pre-implantation oxidation performed prior to the formation of the boron-implanted layer will produce a thin oxide film also on the surface of the phosphorus-implanted layer previously formed. Phosphorus has a large segregation coefficient relative to silicon dioxide, a major component of the oxide film, and tends to segregate in a region in the close vicinity of the major surface of the phosphorus-implanted layer on which the oxide film is grown. If the oxide film in such state is removed and another epitaxial layer is grown thereon in vapor phase, the lateral auto-doping from the phosphorus-implanted layer will become more serious affected by such phosphorus condensed at the major surface.

It is therefore a first subject of the present invention to provide a method capable of quite efficiently producing a silicon epitaxial wafer in which a plurality of epitaxial layers are stacked as being individually interposed with a buried layer and the lateral diffusion of the produced ion-implanted layers is desirably suppressed, and to provide a silicon epitaxial wafer producible by such method. A second suject of the present invention is to provide a method for producing a silicon epitaxial wafer based on the alternative repetition of the ion implantation and formation of the epitaxial layer, in which the number of times of forming a solid mark for use in the pattern alignment can be reduced to thereby facilitate the production processes, and to provide a silicon epitaxial wafer producible by such method. A third subject of the present invention is to provide a method for producing a silicon epitaxial wafer in which the lateral auto-doping from the ion-implanted layer can effectively be suppressed, and to provide a silicon epitaxial wafer producible by such method.

SUMMARY OF THE INVENTION (First Aspect)

A first aspect of the present invention is to solve the foregoing first subject. This relates to a method for producing silicon epitaxial wafer in which an impurity element is introduced by ion implantation to a first epitaxial layer to form an ion-implanted layer, and a second epitaxial layer is stacked thereon by vapor-phase growth to thereby produce a structure having the ion-implanted layer as being buried as a buried layer between the first epitaxial layer and the second epitaxial layer, which comprises:

a mask formation step for forming an ion implantation mask made of a photoresist film directly on the surface of the first epitaxial layer;

an ion implantation step for implanting the ion into the first epitaxial layer having the ion implantation mask formed thereon;

a hydrogen annealing step provided after the ion implantation step and before the vapor-phase growth of the second epitaxial layer; and a vapor-phase growth step for growing in vapor phase the second epitaxial layer after the hydrogen annealing step.

There are two essential points in the production method according to the first aspect. The first point is that a photoresist film, rather than an oxide film, is used for an ion-implantation mask. That is, an ion-implantation mask made of a photoresist film is formed directly on the first epitaxial layer to be implanted with ion, rather than intentionally forming the oxide film on the surface thereof, where formation of a native oxide naturally occurs on the surface of the epitaxial layer at the room temperature or around will be permissible. The second point is that post-implantation annealing for recovering the crystallinity and for carrier activation is proceeded in a hydrogen atmosphere. Forming the ion implantation mask made of a photoresist film directly on the first epitaxial layer means that neither the formation of the ion implantation mask oxide film nor the pre-implantation oxidation is performed, so that the post-implantation annealing for recovering the crystallinity and carrier activation (which may simply be referred to as "crystallinity recovery/activation annealing" hereinafter) is proceeded while the oxide film is not intentionally formed on the surface of the ion-implanted layer.

Now proceeding such crystallinity recovery/activation annealing under the absence of the oxide film on the surface of the ion-implanted layer in a nitrogen atmosphere according to the conventional practice will enhance the surface roughness of the ion-implanted layer after such annealing. The present inventors, however, found out after extensive investigations that proceeding such crystallinity recovery/activation annealing in a hydrogen atmosphere can quite effectively suppress the surface roughening. This allows, in the method for producing the epitaxial wafer having the buried layers, the pre-implantation oxidation to be omitted, and the ion implantation process to be proceeded using only the photoresist films as the mask. Since there is no need to perform the pre-implantation oxidation or any other processes intentionally forming the oxide film, the present invention can solve every aspect of the conventional problem which possibly arises when the oxide film is used as an ion implantation mask, as described below:

(1) since the oxide film is not used as an ion implantation mask, two of three inevitable thermal histories occurred in the prior art can be avoidable; which are the first thermal history in relation to the oxide film formation for producing an ion implantation mask, and the third thermal history in association to the pre-implantation oxidation. Thus the lateral diffusion of the buried layer and the impurity-doped region formed based thereon can effectively be suppressed;

(2) two process steps for forming the oxide film, that are the step for forming the mask oxide film and for pre-implantation, are omissible: and (3) omission of the step for forming the mask oxide film also results in omission of the steps for the pre-oxidation cleaning and for removal by etching of the oxide film. Also the steps for forming the resist film for protecting the backside oxide film can totally or partially be omissible.

This dramatically simplifies the production process of the epitaxial wafer having the buried layer, and in particular that having a plurality of epitaxial layers and ion-implanted layers stacked with each other.

The foregoing production method of the present invention can be applicable also to the case the ion-implanted layer patterns differ in the conduction type are formed in the same epitaxial layer, if the method comprises:

a first ion implantation step for implanting ion of the first impurity into the first epitaxial layer having the first ion implantation mask formed thereon, to thereby form a first ion-implanted layer at the position corresponded to the first region;

a second mask formation step for forming a second ion implantation mask, which is for use in ion implantation of a second impurity which differs from the first impurity in a second region which differs from the first region on the surface of a first epitaxial layer, directly on the surface of such first epitaxial layer using a photoresist film;

a second ion implantation step for implanting ion of the second impurity into the first epitaxial layer having the second ion implantation mask formed thereon, to thereby form a second ion-implanted layer at the position corresponded to the second region;

a hydrogen annealing step provided after the second ion implantation step and before vapor-phase growth of a second epitaxial layer on the first epitaxial layer having the first and second ion-implanted layers formed therein; and a vapor-phase growth step for growing in vapor phase the second epitaxial layer after the hydrogen annealing step, to thereby convert the first ion-implanted layer and the second ion-implanted layer into a first buried layer and a second buried layer, respectively.

In the case the first ion-implanted layer and the second ion-implanted layer are formed in the same the epitaxial layer, using the oxide mask as in the conventional process will require two process cycles comprising oxide film formation, photoresist coating, pattern exposure/development, etching (pattern formation), photoresist removal, ion implantation, and oxide film removal; which are proceeded in this order for each of such two kinds of ion-implanted layers. This requires annealing to be repeated twice for the oxide film formation, which undesirably promotes the diffusion of the doped impurities (in particular in the ion-implanted layer formed earlier). The conventional process also requires etching to be performed twice for each of the pattern formation and oxide film removal, total four times, so that accordingly the photoresist coating for protecting the backside oxide film (backside coating) have to be performed four times.

On the contrary, the method of the present invention not only succeeded in avoiding thermal history accompanied with the oxide film formation, but also in omitting the etching for the pattern formation and the oxide film removal, and in omitting the backside coating; so that entire process is dramatically simplified so as to include the steps only for the photoresist, coating, pattern exposure/development, ion implantation and photoresist removal. Further simplification of the process is expectable since the crystallinity recovery annealing for two kinds of the ion-implanted layers can be effected at the same time.

The production method of the present invention is also applicable to the production of an epitaxial wafer having a plurality of epitaxial layers and buried layers alternately stacked if the process cycle comprising the mask formation steps, the ion implantation steps, the hydrogen annealing step and the vapor-phase growth step is repeated one more time or a plural times, while assuming the second epitaxial layer as a new first epitaxial layer; which results in a plurality of epitaxial layers stacked with each other while being respectively interposed with the buried layer.

According to such method, the thermal histories applied to the individual epitaxial layers are limited to those in association with the heating during the crystallinity recovery/activation annealing in a hydrogen atmosphere after the ion implantation and the heating during the vapor-phase growth, so that the thermal history is less cumulative in the lower buried layers even if a number of epitaxial layers are stacked while being interposed with such buried layers, and thus the thermal histories are respectively applied during the formation of the successive epitaxial layers and buried layers. This successfully reduces difference between degrees of expansion of lower and upper layers, and can effectively suppress the disadvantage that the buried layers in the lower position show larger lateral expansion to thereby ruin the uniformity.

For example, it is advantageous to form the foregoing vertical doped region so that all of the buried layers implanted with the same impurity are separated from each other in the stacking direction of the silicon epitaxial layers. A plurality of such ion-implanted layers can be diffused in the stacking direction of the epitaxial layers (referred to as "vertical direction" hereinafter), to thereby joint with each other to produce the foregoing vertical doped region.

The epitaxial wafer of the present invention obtained by such production method is such that for fabricating therein a device having a structure in which a plurality of impurity-doped regions are interconnected in the stacking direction of a plurality of epitaxial layers, wherein a plurality of the epitaxial layers individually have an ion-implanted layer of the same conductivity type buried in the same region. Such constitution, in which the thermal history is less cumulative, can suppress the expansion of the vertically aligned buried layers, so that, all of such buried layers are vertically aligned as being separated from each other. In such constitution, also the lateral expansion of the buried layers is accordingly suppressed, so that the vertical doped region obtained by diffusing and joining these buried layers will be such that having a uniform width only with a small difference in the expansion (or dimension) between the lower layers and the upper layers. This is also exceptionally advantageous in downsizing of semiconductor devices fabricated using such vertical doped region.

(Second Aspect)

A second aspect of the present invention is to solve the foregoing second subject. This relates to a method for producing silicon epitaxial wafer in which a plurality of epitaxial layers are stacked, while being individually interposed with an ion-implanted layer as a buried layer, which is obtained by repeating a set of process steps comprising a step for implanting ion of an impurity element into a first epitaxial layer to thereby form therein an ion-implanted layer, and a step for growing thereon in vapor phase a second epitaxial layer to thereby convert the ion-implanted layer into a buried layer. The method comprises:

a step for forming on a first epitaxial layer a solid alignment mark as a recess or steps;

a step for forming an ion implantation mask for use in the formation of the ion-implanted layer while being aligned with regard to the first epitaxial layer using such solid alignment mark and transferring a pattern thereto; and a step for forming on the first epitaxial layer a second epitaxial layer so as to produce thereon a copied solid mark in a relieved manner in compliance with the solid alignment mark, and so as to allow such copied solid mark to be used as a new solid alignment mark in a step for forming the next ion-implanted layer.

In such method, the solid alignment mark of the first epitaxial layer as a lower layer is copied at the time the second epitaxial layer is formed as an upper layer to produce a new solid mark, which is now used as a solid alignment mark with regard to the second epitaxial layer. That is, the solid mark is not newly produced in every growth step of the epitaxial layer, so that the number of repetition of forming the solid mark can considerably be reduced, which improves the productivity. More specifically, this allows a method in which the solid mark not being derived from the a solid alignment mark on the underlying epitaxial layer but can serve as a source pattern for forming copied solid marks (referred to as "transfer source solid alignment mark") for the successive epitaxial layers is formed only a part of the layers including the lowermost layer from those having therein the buried layers. In other words, the transfer source solid alignment mark is not formed in the epitaxial layers other than a part of those including the lowermost layer, so that the number or process steps for forming the solid marks can considerably be reduced, which improves the productivity.

The transfer source solid alignment mark can be formed by the wet etching process, or the dry etching process such as ion etching.

A constitution of a silicon epitaxial wafer obtained by such method is understood as follows from the viewpoint of the layers having the transfer source solid alignment mark formed thereon. That is, the silicon epitaxial wafer is such that having a plurality of epitaxial layers individually having a buried layer formed therein stacked with each other, in which only a part of such epitaxial layers including the lowermost layer individually have a transfer source solid alignment mark, which is not derived from a solid alignment mark having a recessed or stepped pattern on the underlying epitaxial layer but can serve as a source pattern for forming copied solid marks for the successive epitaxial layers.

Another possible understanding of the constitution of such silicon epitaxial wafer from the viewpoint of the frequency of appearance of the copied solid marks on the top epitaxial layer is as follows. That is, the silicon epitaxial wafer is such that having a plurality of epitaxial layers individually having a buried layer formed therein stacked with each other, in which the top epitaxial layer has solid alignment marks having a recessed or stepped pattern in the number smaller than the number of epitaxial layers stacked with each other.

In either epitaxial wafer, the epitaxial layers having no transfer source solid alignment mark do not require the foregoing wet etching nor dry etching process, which improves the productivity and the cost efficiency.

It should now be noted that repetitive formation/removal of the oxide film on the surface of the same epitaxial layer in order to form the ion implantation mask or to perform pre-implantation oxidation may decay the surface portion of the epitaxial layer having such solid mark formed thereon due to conversion into the oxide film or removal, which may even result in ruining the original shape of the copied solid mark when a new epitaxial layer is formed thereon. In this case, employing the production method according to the first aspect of the present invention in which the ion implantation mask made of a photo resist film is formed directly on the epitaxial layer will successfully suppress such morphological decay of the solid mark. That is, forming the ion implantation mask using a photoresist film, rather than an oxide film, no more requires repetitive process cycles of the oxide film formation and the removal thereof by etching, and thus the decay of the shape of the solid alignment mark formed in the epitaxial layer hardly occurs. This allows the solid alignment mark in the lower epitaxial layer to be copied to a new epitaxial layer grown thereon, and the copied mark to be used as a new solid alignment mark for the upper epitaxial layer.

Now in the first aspect of the present invention, there is no opportunity to perform wet etching since the pattern formation of the ion-implanted layer does not include a step for etching the oxide film. So that employing dry etching such as ion etching also to the formation of the transfer source solid alignment mark will totally exclude the wet etching process, and accordingly no formation process for forming a resist film for protecting the backside oxide layer will be necessary. This is also beneficial in that generating no waste acidic etching solution, which results in saving costs for waste liquid treatment.

It should now be noted that the description below expresses crystal plane as (hkl) and crystal axis as [hkl] using Miller indices, where the general practice in the nomenclature using Miller indices follows the expressions (i) and (ii) below in which negative sign is placed over the character:

$(h\bar{k}l)$      (i)

$[h\bar{k}l]$      (ii)

(where, h, k, l ≧ 0)

In this specification, however, the descriptions will follow the expressions (i)' and (ii)' shown below for convenience:

(h-kl)      (i)'

[h-kl]      (ii)'

When the solid alignment mark is copied to the second epitaxial layer, the obtained copied solid mark may have changes in the profile thereof due to the vapor-phase growth mechanism. Such deformation of the copied solid mark becomes larger as the thickness of the second epitaxial layer to be formed or the number of transference (i.e., the number of stack of the epitaxial layers) increases. Larger deformation in the copied solid mark will result in degraded accuracy in the mask alignment necessary for forming the ion-implanted layer.

The present inventors found out from extensive investigations that, for the case the epitaxial layers are formed on a silicon single-crystalline substrate having (100) crystal orientation, the solid alignment mark is preferably formed so as to have a straight portion aligned in a direction 45 degrees or less away from the [011] or [0-1-1] direction. The transfer source solid mark having such straight portion satisfying such condition is less causative of the deformation of the copied solid mark in the second epitaxial layer formed thereon, and the straight portion is kept well recognizable with a sharp edge. Thus when such copied solid mark is used as a new solid mark for the next patterning, using such derived straight portion for the alignment will successfully improve the alignment accuracy for forming the ion-implanted layer. Even when a significant number of epitaxial layers are stacked on an epitaxial layer having such transfer source solid alignment mark, the copied solid mark is less likely to deform, and thus the number of the epitaxial layers in need of the transfer source solid alignment mark to be formed can be reduced, which is still more effective in reducing the number of process steps.

In this case, thus obtained epitaxial wafer will be such that having on a silicon single-crystalline substrate with (100) crystal orientation a plurality of epitaxial layers stacked thereon, in which the uppermost epitaxial layer has formed thereon a solid alignment mark having a recessed or stepped pattern, and having the straight portion aligned in the direction 45 degrees or less away from the [011] or [0-1-1] direction. Forming the copied solid mark as having such straight portion allows such mark to be less likely to deform, which results in reducing the number of repetition of forming the copied alignment mark and in improving the process efficiency.

The alignment solid mark having the straight portion aligned in the direction out of the above angular range will increase the degree of the deformation of the corresponded straight portion of the copied solid mark formed in compliance therewith, which makes the edge unclear and may adversely affect the precise alignment.

(Third Aspect)

A third aspect of the present invention is to solve the foregoing third subject. This relates to a method for producing silicon epitaxial wafer in which phosphorus is introduced by ion implantation to a first epitaxial layer to form a phosphorus-implanted layer, and a second epitaxial layer is stacked thereon by vapor-phase growth to thereby produce a structure having the phosphorus-implanted layer as being buried as a buried layer between the first epitaxial layer and the second epitaxial layer, which comprises:

an ion implantation step for implanting phosphorus ion into the first epitaxial layer;

an annealing step provided after the ion implantation step and before the vapor-phase growth of the second epitaxial layer, which is proceeded at an annealing temperature ranging from 950 to 1,100° C. under the normal pressure;

a capping growth step, provided after the annealing step, for growing in vapor phase a capping epitaxial layer by introducing a silicon source gas under reduced pressure; and a main growth step for growing in vapor phase the second epitaxial layer on the capping epitaxial layer. The silicon source gas is hydrogen-diluted dichlorosilane ($SiH_2Cl_2$), trichlorosilane ($SiHCl_3$) or silicon tetrachloride ($SiCl_4$).

In the above method, the phosphorus-implanted layer is formed by ion implantation of phosphorus, annealed at a temperature from 950 to 1,150° C., and then two-step growth of the epitaxial layer is proceeded by first growing in vapor phase a capping epitaxial layer for the protection against the auto-doping in a silicon source gas atmosphere under the reduced pressure, and then proceeding the main growth step for growing in vapor phase the second epitaxial layer on the capping epitaxial layer, which can quite effectively suppress the auto-doping of phosphorus.

It has been a general understanding that a higher annealing temperature results in a larger amount of the auto-doping. The present inventors made researches on the auto-doping of phosphorus under the normal pressure within a annealing temperature ranging from 850 to 1,200° C., and found that the amount of auto-doping becomes smaller in contrast to the previous knowledge within a temperature range from 950 to 1,100° C., where a minimum value was observed at 1,080° C. or around.

It is considered that, in a temperature range from 950 to 1,100° C. under the normal pressure, phosphorus will cause outward diffusion at a constant volume from the epitaxial layer to the vapor phase, while the amount of re-doping from the vapor phase to the epitaxial layer will decrease. Employing now the annealing temperature ranging from 950 to 1,100° C. under the normal pressure can promote the outward diffusion of phosphorus but can suppress the amount of the re-doping into the crystal, so that the phosphorus concentration in the surface region of the phosphorus-doped layer decreases, which provides a situation advantageous for preventing the auto-doping of phosphorus. Growing the capping epitaxial layer in the vapor phase in particular under the supply of a silicon source gas under reduced pressure will also successfully suppress the auto-doping of phosphorus which possibly occurs when the surface of the phosphorus-doped layer is capped. Thus the lateral auto-doping of phosphorus is remarkably suppressed over the entire processes. Reducing the pressure during the annealing or an annealing temperature out of the range from 950 to 1,100° C. while the pressure being kept in the normal range, will result in insufficient effects in preventing the lateral auto-doping of phosphorus. Growing the capping epitaxial layer in vapor phase under normal or increased pressure will also result in insufficient effects in preventing the lateral auto-doping of phosphorus. The reason why dichlorosilane, trichlorosilane or silicon tetrachloride is used as a silicon source gas for forming the capping epitaxial layer is that such gas allows the film to grow at a high speed and to thereby shorten the growth period during which the lateral diffusion of phosphorus most tends to occur, which is further advantageous in preventing the lateral auto-doping of phosphorus, and that such silicon source gases are easy to handle. It is now also allowable to use dichlorosilane, trichlorosilane or silicon tetrachloride also for the main growth, which will desirably shorten the growth period required for growing the second epitaxial layer to a desired thickness, and which can omit the changeover operation of the source gases between the steps for forming the capping epitaxial layer and the major growth, which is advantageous in terms of shortening the process time and simplification of the production facility.

Such prevention of the auto-doping of phosphorus can achieve a constitution of the silicon epitaxial wafer for the case a plurality of p-type epitaxial layers are stacked while being interposed at the individual interfaces thereof with a phosphorus-implanted layer. That is, the epitaxial layer can be formed so as to have a value calculated by a formula below is 0.5 or below:

$$(A_H - B_H)/A_H$$

where, $A_H$ represents the average net carrier concentration in a region of the epitaxial layer having a most stable carrier concentration, and $B_H$ represents a lowest net carrier concentration at the interface of the epitaxial layers, both values being observed when the net carrier concentration profile of the epitaxial layer is measured at a position adjacent to the phosphorus-implanted layer and not crossing such phosphorus-implanted layer, and along the thickness of the epitaxial layer so as to cross the interface between the adjacent epitaxial layers. Controlling the value $(A_H - B_H)/A_H$ as 0.5 or below at a position adjacent to the phosphorus-implanted layer can make the lateral distribution of the net carrier concentration more uniform, which accordingly provides a device showing stable and excellent characteristics. The net carrier concentration in the context herein means a difference between the concentrations of majority carrier and minority carrier, and can be obtained typically by converting values of spreading resistance into carrier concentrations.

(Fourth Aspect)

A fourth aspect of the present invention is to solve the foregoing third subject. This relates to a method for producing silicon epitaxial wafer in which a boron-buried layer and a phosphorus buried layer are formed at the same time on a single substrate. The method comprises:

a boron implantation step for implanting boron into a first region in a first epitaxial layer, to thereby form a boron-implanted layer at the position corresponded to the first region;

a phosphorus implantation step for implanting phosphorus into a second region which differs from the first region in the first epitaxial layer, to thereby form a phosphorus-implanted layer at the position corresponded to the second region;

a pre-implantation annealing step for oxidizing the surface of the first epitaxial layer provided before the phosphorus implantation step; and a vapor-phase growth step for growing in vapor phase a second epitaxial layer on the first epitaxial layer having the boron-implanted layer and the phosphorus-implanted layer formed therein, to thereby convert such boron-implanted layer and such phosphorus-implanted layer into a boron-buried layer and a phosphorus-buried layer, respectively.

In a general method for producing a silicon epitaxial wafer, a step for forming an ion implantation mask oxide film, it is very common to provide a pre-implantation oxidation step or a step for forming an ion implantation mask oxide film in which an oxide film used as a mask is formed. The oxide film in such case is mainly composed of silicon dioxide. When the oxide film is formed on the boron-implanted layer and the phosphorus-implanted layer, boron and phosphorus show different behaviors. That is, boron tends to be incorporated into such oxide film, while phosphorus tends to accumulate in the vicinity of the interface with such oxide film, which is ascribable to difference between the segregation coefficients of boron and phosphorus relative to silicon dioxide. A problem now arises in particular on the order of steps for forming the phosphorus-implanted layer and for forming the oxide film on the epitaxial layer in which such phosphorus-implanted layer is formed. If the phosphorus-implanted layer is formed first, and the pre-implantation oxidation of the surface of the first epitaxial layer, in which the phosphorus-implanted layer is already formed, is then performed prior to the formation of the other ion-implanted layer, phosphorus undesirably migrates toward the interface with the oxide layer, or the surface portion of the phosphorus-implanted layer, which tends to cause the lateral auto-doping of phosphorus during the vapor-phase growth of the second epitaxial layer formed on such first epitaxial layer. On the contrary in the method of the present invention, since the pre-implantation oxidation step is always provided before the phosphorus implantation step, so that it may be an unusual situation that phosphorus is concentrated at the surface portion of the phosphorus-implanted layer before the second epitaxial layer is grown, which effectively suppresses the lateral auto-doping of phosphorus.

In an exemplary case in which the phosphorus-implanted layer is first formed in an epitaxial layer, and the boron-implanted layer is then formed in the same epitaxial layer, performing the pre-implantation oxidation before forming the boron-implanted layer will inevitably form the oxide film also on the surface of the phosphorus-implanted layer previously formed. Now performing the phosphorus implantation step after the boron implantation step can successfully avoid the situation that the pre-implantation oxidation before the boron implantation precedes the phosphorus implantation, which is beneficial in avoiding the lateral auto-doping of phosphorus. It is still more preferable that the pre-implantation oxidation is performed even before the boron implantation, since the surface roughening of the epitaxial layer possibly occurs during the boron implantation is avoidable.

After the ion-implanted layer is formed, annealing is generally performed in order to recover the crystal damage generated during the ion implantation. In place of separately performing such annealing after the phosphorus implantation, performing the annealing before the vapor-phase growth of the second epitaxial layer so as to recover the crystal damage generated during the ion implantation is more advantageous in preventing the lateral auto-doping of phosphorus, and can prevent excessive spreading of the buried layer due to thermal diffusion. The crystal damage can also be recovered by thermal history applied during the vapor-phase growth of the second epitaxial layer, or by the thermal diffusion process provided after the formation of the second epitaxial layer (for example, a process for forming the foregoing vertical doped region).

(Fifth Aspect)

A fifth aspect of the present invention is also to solve the foregoing third subject, and is applicable in any combinations with the foregoing first to fourth aspects (or sixth or seventh aspect described later). The method is such that producing a silicon epitaxial wafer in which a plurality of epitaxial layers individually having an ion-implanted layer of the same conductivity type formed as being buried in the same region are stacked with each other, wherein elements to be implanted are boron and phosphorus, and a ratio of the amounts of dose of boron and phosphorus to be implanted in the same epitaxial layer is controlled so as to be inversely proportional to a ratio of the implantation pattern areas of boron and phosphorus. The implantation pattern area of phosphorus is preferably 3 to 10 times that of boron. The amount of dose of phosphorus is preferably $1/3$ to $1/10$ of that of boron.

Such production method can produce a silicon epitaxial wafer having a structure in which a plurality of impurity-doped regions are interconnected in the stacking direction of a plurality of epitaxial layers; a plurality of such epitaxial layers individually have an ion-implanted layer of the same conductivity type buried in the same region; element to be implanted are boron and phosphorus; and a ratio of the amounts of dose of boron and phosphorus to be implanted in the same epitaxial layer is controlled so as to be inversely proportional to a ratio of the implantation pattern areas of boron and phosphorus.

In an exemplary case in which boron and phosphorus are individually implanted into the same epitaxial layer in the same implantation pattern area and at the same amounts of dose, phosphorus will cause auto-doping in an amount 3 to 10 times larger than that of boron if an epitaxial layer is grown by vapor phase deposition so as to bury the implanted layers. Such difference in the amount of auto-doping emphasizes the lateral auto-doping of phosphorus in the vicinity of the interface of the epitaxial layers.

If the amounts of auto-doping of phosphorus and boron can be equalized, the lateral auto-doping from the ion-implanted layer can effectively be suppressed since both impurities will cancel with each other. Thus the amounts of auto-doping of phosphorus and boron are measured in a preliminary study, and the implantation pattern areas and the amounts of dose for both impurities are determined so as to equalize the amounts of auto-doping thereof.

That is, based on a proportional relation between the amount of auto-doping and the surface impurity concentration of the ion-implanted layer, the implantation pattern area for phosphorus showing a larger auto-doping is set 3 to 10 times that for boron, and the amount dose of phosphorus is set $1/3$ to $1/10$ of that for boron. This can reduce the amount of auto-doping of phosphorus while keeping the total amount of implantation thereof unchanged, so that a uniform distribution of doped impurity concentration can be achieved in the vicinity of the interface between the epitaxial layers.

(Sixth Aspect)

A sixth aspect of the present invention is effective in achieving a uniform concentration distribution in the obtained vertical doped region, and is applicable in any combinations with the foregoing first to fifth aspects (or a seventh aspect described later). The method is such that producing a silicon epitaxial wafer in which a plurality of epitaxial layers individually having an ion-implanted layer of the same conductivity type formed as being buried in the same region are stacked with each other, wherein the ion-implanted layers are formed so that a lower one have a higher concentration of the implanted impurity. A silicon epitaxial wafer obtained by the method is such that for fabricating therein a device having a structure in which a plurality of impurity-doped regions are interconnected in the stacking direction of a plurality of epitaxial layers, wherein a plurality of the epitaxial layers individually have an ion-implanted layer of the same conductivity type buried in the same region, and the ion-implanted layers are formed so that the layer in a lower position will have a higher concentration of the implanted impurity.

For the case of forming a structure in which a plurality of epitaxial layers individually having an ion-implanted layer of the same conductivity type formed as being buried in the same region are stacked with each other, an essence of this aspect resides in that forming the ion-implanted layers so that a lower one have a higher concentration of the implanted impurity. An ion-implanted layer in a lower position is affected by repetitive annealing for the formation of the overlying epitaxial layer(s), ion-implanted layer(s) and oxide film(s), and thus tends to cause expansion due to thermal diffusion and tends to lower the impurity concentration. Thus as shown in FIGS. 28A to 28C, ion-implanted layers 250 to 252 are formed so that the lower epitaxial layer among epitaxial layers 103a to 103c stacked with each other, in other words an epitaxial layer formed earlier, will have a higher concentration of the doped impurity. This can reduce the differences among the concentration of implanted impurity of buried layers 250', 251' and 252' aligned in the direction of the stacking of the epitaxial layers 103a to 103d, as shown in FIG. 28D. That is, assuming the individual concentrations of ion implantation for the ion-implanted layers 250 to 252 as C1, C2 and C3, respectively, a relation expressed by C1>C2>C3 is satisfied. This can be achieved by increasing the amount of dose of implanted ion as the position of the epitaxial layer in the stack descends.

The ion-implanted layers 250 to 252 are formed herein so that a lower one has a smaller pattern area. That is, assuming the pattern areas for the ion-implanted layers 250 to 252 as S1, S2 and S3, respectively, a relation expressed by S1<S2<S3 is satisfied. Accordingly the differences among the pattern area of the buried Blayers 250', 251' and 252' can also be reduced as shown in FIG. 28D.

For example, for the case that the buried layers are formed in a number of three as described in the above while assuming the amounts of dose in the ion implantation for forming such layers as D1, D2 and D3, respectively, such amounts of dose are preferably set so that a relation expressed by an equation below is satisfied from the viewpoint of reducing the differences among the impurity concentrations of the buried layers 250', 251' and 252':

$$D1:D2:D3=(S2/S1)^2 \times C2:C2:(S2/S3)^2 \times C2$$

Such relation between the amount of dose and the pattern area is applicable also to the case the buried layers are formed in a number of three. Thus the vertical doped region obtained by diffusing such buried layers by annealing is uniform not only in the impurity concentration but also in the axial sectional area, which can, for example, improve the integration density of devices fabricated using such vertical doped region.

(Seventh Aspect)

This aspect of the present invention can be combined with any one of the foregoing aspects 1 to 6, or effected independently therefrom. This relates to a method for fabricating a silicon epitaxial wafer in which a plurality of epitaxial layers are stacked with each other while being individually interposed with an ion-implanted layer, by repeating a set of process steps comprising:

- a first vapor phase deposition step for growing in vapor phase first epitaxial layer;
- a first ion implantation step for implanting ion of a first impurity element into a first region in the surface portion of the first epitaxial layer, to thereby form a first ion-implanted layer;
- a second vapor phase deposition step for growing in vapor phase a second epitaxial layer after the first ion implantation step; and
- a second ion implantation step for implanting ion of a second impurity element into a second region which differs from the first region in the surface portion of the first epitaxial layer, to thereby form a second ion-implanted layer at the position corresponded to such second region;
- so as to form all of the first ion-implanted layers and all of the second ion-implanted layers are respectively formed in the same region, and so as to stagger the first and second ion-implanted layers.

A specific embodiment is shown in FIGS. 29A to 29C. In this embodiment, an epitaxial layers 103 are stacked while being interposed with a boron-implanted layer 71 as the first ion-implanted layer and a phosphorus-implanted layer 72 as the second ion-implanted layer, where both layers 71, 72 being staggered. As described in the above, there is a large difference between boron and phosphorus in the lateral auto-doping behavior, and growth conditions for the epitaxial layers allowing such difference to be minimized also differ. For the case such two kinds of impurities which differ in the lateral auto-doping behavior are implanted into the same epitaxial layer, a growth condition for growing thereon the second epitaxial layer will suffer from a contradiction that a condition optimum for one impurity in terms of suppressing auto-doping is not advantageous for the other. Even though a compromising condition for both impurities is employed, the conditions remain as being not optimized in terms of suppressing the lateral auto-doping. Employing now the method of the present invention allows the growth conditions for minimizing the lateral auto-doping of one impurity can be determined independently from that for the other for each epitaxial layer, since each epitaxial layer has only either one of the first ion-implanted layer and the second ion-implanted layer. This effectively suppresses the lateral auto-doping of both buried layers having the individual impurities.

When thus-obtained silicon epitaxial wafer is subjected to the annealing, the ion-implanted layers formed in the individual epitaxial layers are mutually joined in the stacking direction of such epitaxial layers, to thereby produce a plurality of vertical impurity doped regions (a vertical boron-doped region 171 and a vertical phosphorus-doped region 172, herein) as shown in FIG. 29E. Characteristics of such wafer are as follows. There are formed the boron-doped region 171 doped with boron (first impurity) and the phosphorus-doped region 172 doped with phosphorus (second impurity), where both of which respectively have minimum diameter portions 171*b*, 172*b* and maximum diameter portions 171*a*, 172*a* alternately aligned along an axial direction which coincides with the stacking direction of the epitaxial layers 103, to thereby have a corrugated columnar form. These boron-doped region 171 and the phosphorus-doped region 172 individually have staggered periodicities of formation of such minimum diameter portions 171*b*, 172*b* and maximum diameter portions 171*a*, 172*a*, wherein the maximum diameter portions 171*a*, 172*a* of either one and the minimum diameter portions 171*b*, 172*b* of the other are aligned at the same level, respectively. This allows the inter-axial distance between the boron-doped region 171 and the phosphorus-doped region 172 to be narrowed, to thereby increase the integration density of devices fabricated by using such impurity-doped regions 171, 172.

In such case, if the adjacent boron-doped region 171 and the phosphorus-doped region 172 are formed so that the maximum diameter portions 171*a*, 172*a* thereof are partially overlapped in the plan view, that is in other words, if a projected portion of one doped region having a larger diameter is aligned so as to come into a recessed portion of the other doped region having a small diameter, the inter-axial distance between the boron-doped region 171 and the phosphorus-doped region 172 can further be narrowed, which further enhances the foregoing effect. In such case, a first ion-implanted layer 71 and the second ion-implanted layer 72 adjacent as being interposed by the epitaxial layer 103 are formed so as to partially overlap with each other when viewed from the stacking direction of such epitaxial layers 103. More specifically, the first ion-implanted layers 71 and the second ion-implanted layers 72 always formed in the same epitaxial layer as shown in FIG. 30A give an outer dimension "A", and the first ion-implanted layers 71 and the second ion-implanted layers 72 formed alternately in the adjacent epitaxial layers in a partially overlapped manner as shown in FIG. 30A give an outer dimension "B", which can be reduced as much as by approx. 6% from "A".

(Eighth Aspect)

An eighth aspect of the present invention relates to a method for producing a silicon epitaxial layer, which can be corresponded to a combination of the first and third aspects (where a source gas for forming the epitaxial layers are not limited to trichlorosilane, and an impurity is not limited to phosphorus). The method is such that producing a silicon epitaxial wafer in which a plurality of epitaxial layers are stacked, while being individually interposed with an ion-implanted layer as a buried layer, by repeating a set of process steps comprising:

- a first vapor-phase growth step for growing vapor phase a first epitaxial layer on a silicon single-crystalline substrate having a major front surface of (100) crystal orientation;
- a first mask formation step for forming a first ion implantation mask, which is for use in ion implantation of a first impurity in a first region on the surface of the first epitaxial layer, directly on the surface of such first epitaxial layer using a photoresist film;
- a first ion implantation step for implanting ion of the first impurity into the first epitaxial layer having the first ion implantation mask formed thereon, to thereby form a first ion-implanted layer at the position corresponded to the first region;
- a second mask formation step for forming a second ion implantation mask, which is for use in ion implantation of a second impurity which differs from the first impurity in a second region which differs from the first region on the surface of a first epitaxial layer, directly on the surface of such first epitaxial layer using a photoresist film;

a second ion implantation step for implanting ion of the second impurity into the first epitaxial layer having the second ion implantation mask formed thereon, to thereby form a second ion-implanted layer at the position corresponded to the second region;

a hydrogen annealing step provided after the second ion implantation step, which is proceeded at an annealing temperature ranging from 950 to 1,100° C. under the normal pressure; and a capping growth step, provided after said hydrogen annealing step, for growing in vapor phase a capping epitaxial layer under reduced pressure as a lot, stackingly forming several epitaxial layers, by the repetition of two or more groups of those steps, in the form by which ion-implantation layers are sandwiched as buried layers between layers.

A specific feature now resides in that the hydrogen annealing step provided after the second ion implantation step, which is proceeded at an annealing temperature ranging from 950 to 1,150° C. under the normal pressure, also serves as the annealing in the third aspect. Growing in vapor phase the capping epitaxial layer under reduced pressure after the hydrogen annealing ensures not only various effects of the first aspect, but also the effect of the third aspect which relates to the effective suppression of the lateral auto-doping of phosphorus.

In the above method, the effect of the second aspect is also obtainable if the solid alignment mark is formed so as to have a straight portion comprising a recessed or stepped portion and aligned in a direction 45 degrees or less away from the [011] or [0-1-1] direction. It is still also possible to obtain the effect of the fifth aspect if the ion-implanted layers are formed so that the layer in a lower position will have a higher dosage and a smaller pattern area.

BRIEF DESCRIPTION OF THE DRAWINGS

FIGS. 4A and 4B are schematic sectional views showing continuous process steps of the hydrogen annealing step and the vapor-phase growth step in a vapor-phase growing apparatus;

FIGS. 28A to 28D are schematic views showing process steps in a production method according to the sixth aspect;

FIGS. 29A to 29E are schematic views showing process steps in a production method according to the seventh aspect; and, FIGS. 30A and 30B are schematic views showing an exemplary effect of the seventh aspect.

BEST EMBODIMENTS FOR CARRYING OUT THE INVENTION

Embodiments of the present invention will be detailed hereinafter referring to the attached drawings.

An exemplary case discussed herein relates to a production method of an epitaxial wafer in which a plurality of n⁻-type (low concentration n-type) silicon epitaxial layers, alternately having two kinds of ion-implanted layers differ in the conductivity type formed therein, are stacked on a silicon single-crystalline substrate doped with an impurity so as to attain a predetermined conductivity type. In order to clarify operations and effects of the first aspect of the present invention, the description below will be given in an order such that first describing Referential Technical Example 1 which relates to a method for producing an epitaxial wafer according to a referential technique in which an oxide film is used as an ion implantation mask, and then describing Embodiment of First Aspect in comparison with such Referential Technical Example. The aspects other than the first aspects will be discussed en bloc basically after the completion of such Embodiment of First Aspect. It should now be noted that "referential technique" in the context herein means a technique to be compared cited in order to further clarify the features and superiority of the Embodiment of first aspect, and in consequence does not mean a known prior art.

Referential Technical Example 1

A referential technique will be explained referring to FIGS. 14A to 17. FIG. 17 is a process flow chart showing an exemplary case forming 6 buried layers.

Figure 14A:
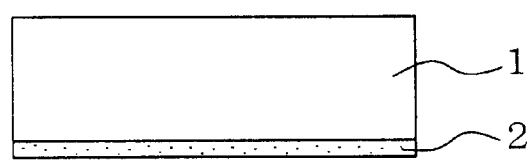
FIGS. 14A to 14F are schematic views showing process steps of a method for producing an epitaxial wafer according to a referential technique (an embodiment of the fourth aspect)
Figure 14B:
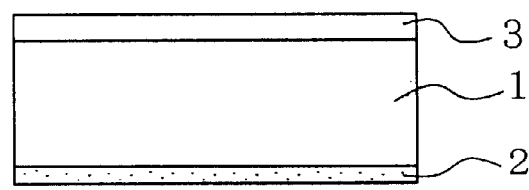

First as shown in FIG. 14A, a silicon single-crystalline substrate 1 having on the backside thereof a backside oxide film 2 formed typically by the CVD process is obtained. In this embodiment, the silicon single-crystalline substrate 1 (simply referred to as "substrate 1" hereinafter) is an n⁺-type (high concentration n-type) substrate doped with antimony so as to attain a resistivity of 0.010 to 0.015 Ω·cm and has <100> crystal axis orientation, while being not limited thereto. Next, as shown in FIG. 14B, an n⁻-type first silicon epitaxial layer 3 (also simply referred to as "epitaxial layer 3" hereinafter) is grown in vapor phase on the major surface of such silicon single-crystalline substrate 1. Here the silicon single-crystalline substrate 1 is placed in a vapor-phase growth apparatus, and prior to the growth of the epitaxial layer 3, the silicon single-crystalline substrate 1 is annealed at a predetermined temperature (for example, 1,100° C. in a hydrogen atmosphere), and then the epitaxial layer 3 is grown thereon (for example, thickness: 5 to 10 μm, resistivity: 10 to 50 Ω·cm) (process step 1 in FIG. 17).

FIG. 4B is a schematic sectional view showing an exemplary vapor-phase growth apparatus 121. The vapor-phase growth apparatus 121 has a flat-box-shaped reaction unit 122 having a gas inlet port 171 provided on one end thereof, through which a source gas SG is introduced via a flow regulation portion 124 into an inner space of a main vessel 123 in a horizontal and unidirectional manner. In such main vessel 123, only one wafer W is placed in an approximately horizontal manner on a susceptor 112 housed in a susceptor housing portion 110. Although a target to be processed herein is a silicon single-crystalline wafer, later description will be made on the silicon epitaxial wafer having epitaxial layer(s) stacked thereon referring again to FIGS. 4A and 4B, so that a target to be processed will simply be referred as "wafer W" in the description below. The reaction unit 122 has on the other end opposite to the gas inlet port 171 a venturi-formed area reduction portion 129 and a gas discharge port 128 connected thereto. The source gas SG introduced through the gas inlet port 171 flows over the wafer W and then discharged out from the gas discharge port 128. The source gas SG is typically trichlorosilane (SiHCl₃), which is optionally added with a dopant gas [phosphine (PH₃) is employed herein for introducing an n-type impurity] and H₂ as a carrier gas. An epitaxial layer is grown under supply of the source gas SG on the wafer W which is rotated together with the susceptor 112 with the aid of a motor M and is heated by an infrared heating lamp 111.

Return back to FIGS. 14A to 14F, on the epitaxial layer 3 formed on the major surface of the silicon single-crystalline substrate 1, a mark-patterning oxide layer 4 for use in forming a solid alignment mark 7 (simply referred to as "solid mark 7" occasionally) as shown later in FIG. 14F is formed. The solid alignment mark 7 is for use in alignment of a pattern of the ion-implanted layer, and such mark-patterning oxide layer 4 is formed by a photolithographic process described below (which is entirely applicable also to the to a step for forming an ion implantation mask oxide film described later). First, the wafer having the epitaxial layer 3 formed thereon is cleaned (process step 2 in FIG. 17), then the surface of the epitaxial layer 3 is subjected to thermal oxidation in an oxidation furnace to thereby form the mark-patterning oxide film 4 of approx. 600 nm thick (process step 3 in FIG. 17). Next, a photoresist film 51 is formed thereon, which is followed by the a light exposure/development process to thereby transfer a pattern of the solid mark to the photoresist film 51 (process steps 4 to 6 in FIG. 17).

Figure 14C:
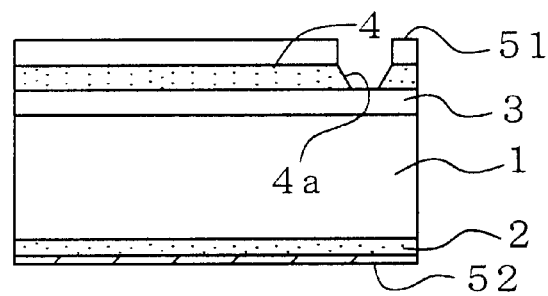
Figure 14D:
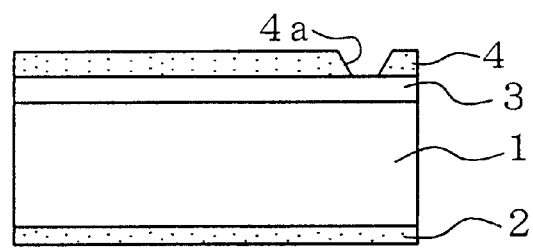
Figure 14E:
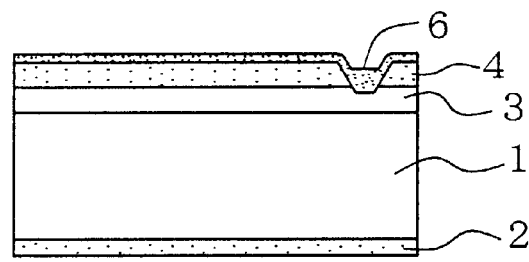

Although the mark-patterning oxide film 4 is finally patterned by a wet etching process as being masked with the photoresist film 51, the next process prior to such patterning relates to a backside coating process in which a photoresist film is coated on the backside oxide layer 2 to thereby form a protective film 52 (FIG. 14C) in order to protect such backside oxide film 2 from the wet etching (process step 7 in FIG. 17). Proceeding the wet etching in such state allows a pattern opening 4a for the solid mark to be formed in the mark-patterning oxide layer 4 (FIG. 14C, process step 8 in FIG. 17). FIG. 14D shows the wafer from both sides of which both photoresist films 51, 52 are removed (process step 9 in FIG. 17).

Figure 14F:
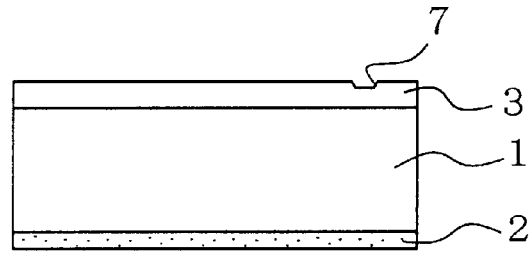

The wafer is cleaned again (process step 10 in FIG. 17), then a mark-forming oxide layer 6 is formed on the surface of the epitaxial layer 3 exposed within the pattern opening 4a to a predetermined thickness (600 nm, for example) (process step 11 in FIG. 17). After protecting the backside oxide layer 2 by the backside coating process (process step 12 in FIG. 17), the oxide films 4, 6 are removed by the wet etching process (process step 13 in FIG. 17), to thereby form the solid mark 7 as a recess at a position and shape corresponded to those of the pattern opening 4a shown in FIG. 14D, where the solid mark 7 has a depth corresponded to the thickness of a portion of the epitaxial layer 3 oxidized during the formation of the mark-forming oxide film 6. The photoresist film on the backside is then removed (FIG. 14F, process step 14 in FIG. 17).

Figure 15A:
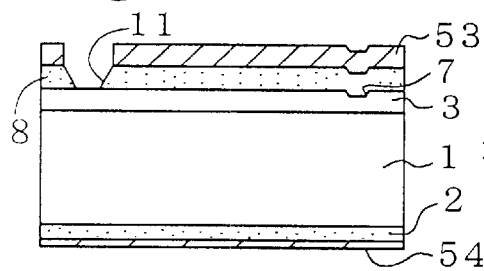
FIGS. 15A to 15I are schematic views showing process steps as continued from FIG. 14F.
Figure 15B:
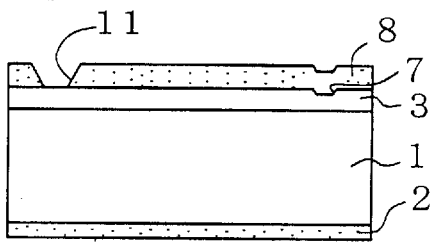

On the epitaxial layer 3, an ion implantation mask oxide film 8 for forming a boron-implanted layer in such epitaxial layer 3 is then formed by the thermal oxidation process. The process basically comprises a series of unit processes of wafer cleaning, thermal oxide film formation, photoresist film formation, pattern exposure/development, backside coating, wet etching (formation of a pattern opening), photoresist film removal and cleaning, proceeded in this order (process steps 15 to 23 in FIG. 17), which are similar to those for the formation process of the mark-forming oxide film 4. FIG. 15A shows a wafer after completion of the wet etching, and FIG. 15B shows a wafer after removal of the photoresist film (reference numerals 53, 54 in FIG. 15A), where the ion implantation mask oxide film 8 has a pattern opening 11 through which the boron-implanted layer is formed.

Figure 15C:
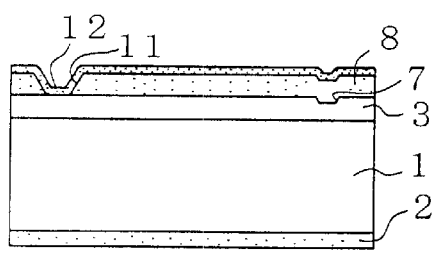
Figure 15D:
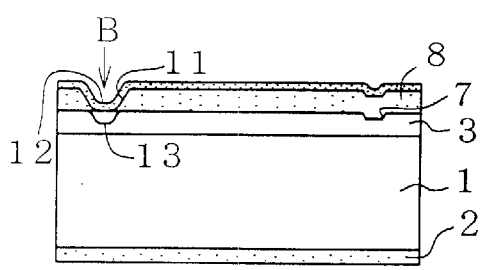

Next, as shown in FIG. 15C, the wafer is subjected to the pre-implantation oxidation to thereby form an oxide film 12 (thickness: 50 nm, for example) for preventing surface roughening in a portion of the epitaxial layer 3 exposed within the pattern opening 11 (process step 24 in FIG. 17). Ion implantation of boron (B) is then performed according to the known general practice as shown in FIG. 15D (implantation energy: typically 50 to 70 keV, dosage: $2 \times 10^{12}/cm^2$), to thereby form a boron-implanted layer 13 in the epitaxial layer 3 at the position corresponded to the pattern opening 11 (process step 25 in FIG. 17). The pattern opening 11 formed by the wet etching of the oxide film tends to have a tapered inner profiles shown in FIG. 15E, which is causative of non-uniformity in the resultant area of the boron-implanted layers 13.

Figure 12A:
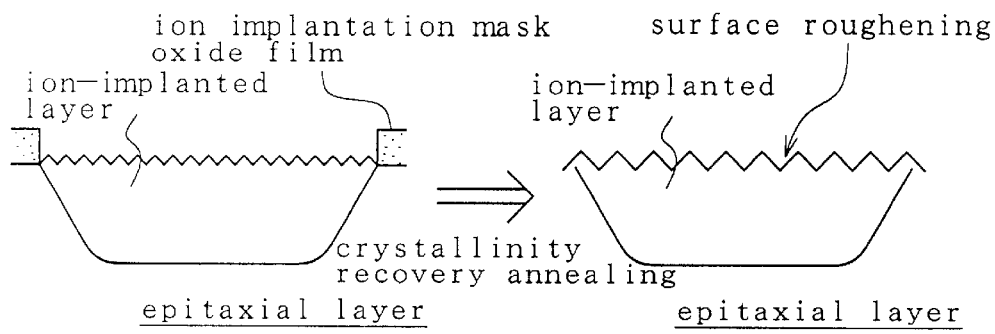
FIGS. 12A and 12B are schematic views showing an ion-implanted layer having surface roughening occurred thereon during the crystal recovery annealing, and the ion-implanted layer being successfully prevented therefrom by the pre-implantation oxidation.
Figure 12B:
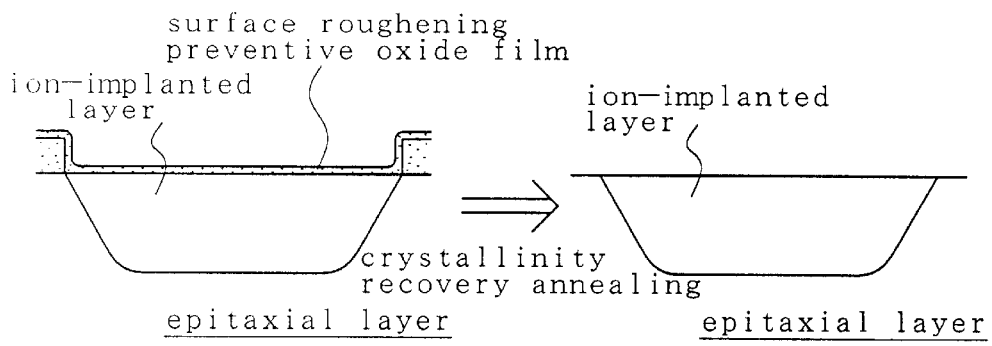
Figure 15E:
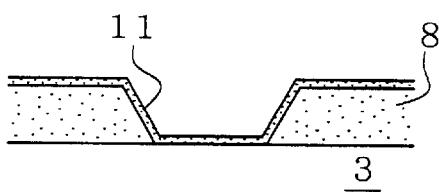
Figure 15F:
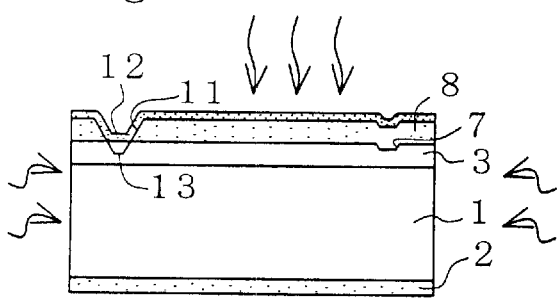
Figure 15G:
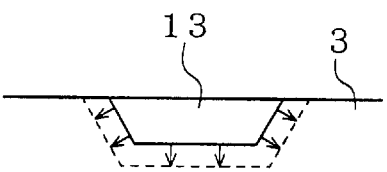

Next, as shown in FIG. 15F, the wafer is subjected to the crystallinity recovery/activation annealing for recovering crystal damage generated in the epitaxial layer 3 during the ion implantation process and for activating carriers (for example at 950° C. for 30 minutes) under a nitrogen atmosphere while being covered with the oxide film 12 (process step 26 in FIG. 17). Performing the crystallinity recovery/activation annealing in the presence of the oxide film 12 remained on the wafer as shown in FIG. 12B can successfully prevent the boron-implanted layer 13 (ion-implanted layer) from being roughened on the surface thereof. Thermal history in this annealing (corresponded to the second thermal history described in the Background Art) causes a slight expansion of the boron-implanted layer 13 due to thermal diffusion.

After completion of the crystallinity recovery/activation annealing, the ion implantation mask oxide film 18 and the oxide film 12 for preventing surface roughening are removed again by performing the backside coating and the wet etching processes in this order (process steps 27, 28 in FIG. 17). The oxide film 8 is formed so as to consume the surface portion of the epitaxial layer 3 by the oxidation, so that removal of such oxide film 8 gives the solid mark 7 having a width d' increased from the initial width d by an amount corresponded to the margin for forming the oxide film, which results in deformation of the solid mark 7 as shown in FIG. 15I.

Figure 16A:
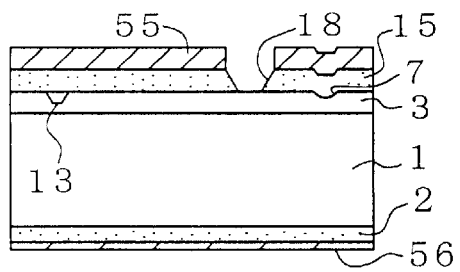
FIGS. 16A to 16I are schematic views showing process steps as continued from FIG. 15I.
Figure 16B:
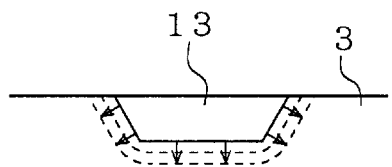
Figure 17:
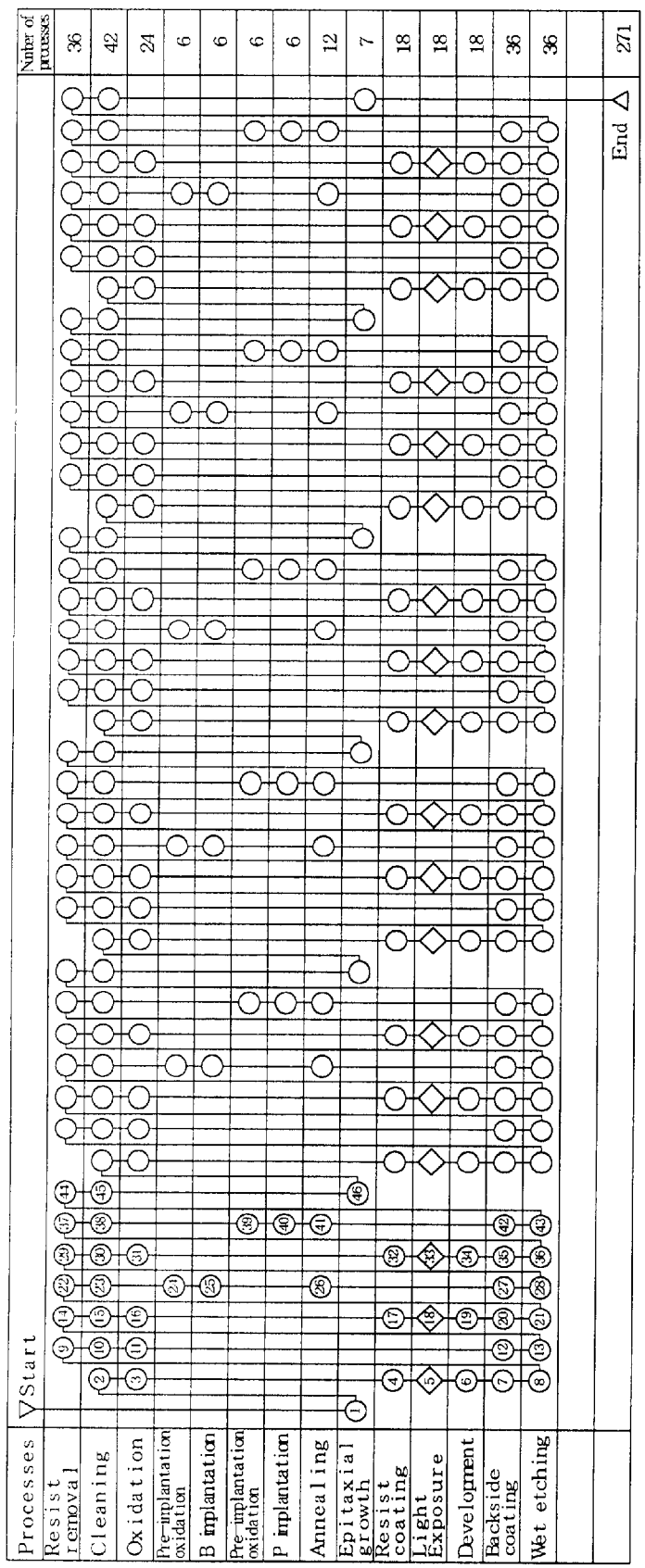
FIG. 17 is a process flow chart showing an exemplary case forming 6 buried layers according to the process steps of the above referential technique.

Next, as shown in FIG. 16A, an ion implantation mask oxide film 15 for forming a phosphorus-implanted layer into the epitaxial layer 3 is formed in an entirely similar manner with the case the boron-implanted layer was formed (process steps 29 to 38 in FIG. 17). Now the reference numerals 55 and 56 denotes photoresist films. A pattern opening 18 through which the phosphorus-implanted layer will be formed is formed in the ion implantation mask oxide film 15. The annealing for forming the oxide film 15 (corresponded to the first thermal history) is now causative of further expansion of the boron-implanted layer 13 previously formed.

Figure 16C:
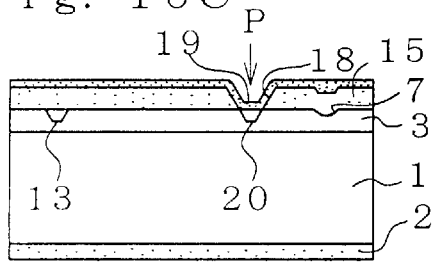
Figure 16D:
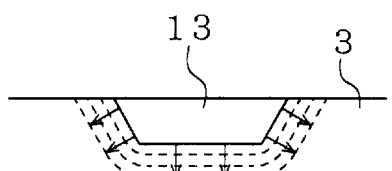
Figure 16E:
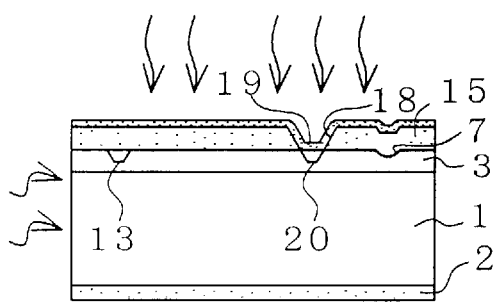
Figure 16F:
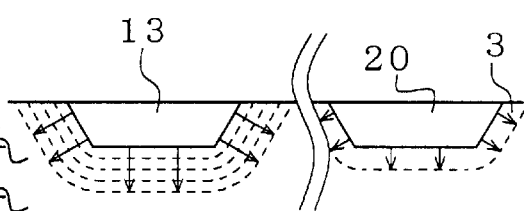

The wafer is again subjected to the pre-implantation oxidation as shown in FIG. 16C (formation of an oxide film 19 for preventing the surface roughening, process step 39 in FIG. 17), where the thermal diffusion of the boron-implanted layer 13 further proceeds due to the annealing (corresponded to the third thermal history) in such oxidation. Ion implantation of phosphorus (P) is then performed (implantation energy: typically 120 to 150 keV, dosage: $2 \times 10^{12}/cm^2$), to thereby form a phosphorus-implanted layer 20 in the epitaxial layer 3 at the position corresponded to the pattern opening 18 (process step 40 in FIG. 17). Next, as shown in FIG. 16E, a wafer is subjected to the crystallinity recovery/activation annealing for the phosphorus-implanted layer 20 while being covered with the oxide film 19 (process step 41 in FIG. 17). Thermal history in this annealing (second thermal history) causes the thermal diffusion of the boron-implanted layer 13 and the phosphorus-implanted layer 20.

Figure 16G:
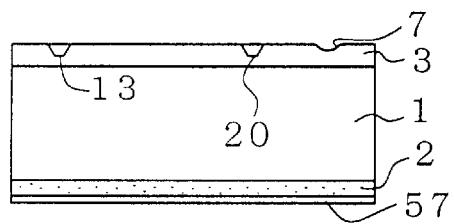
Figure 16H:
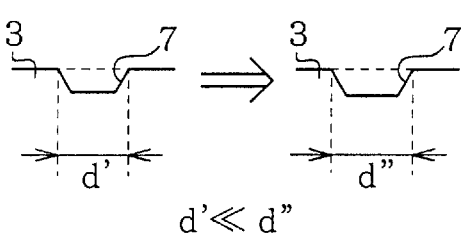
Figure 16I:
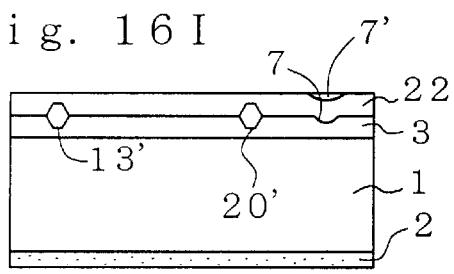

After the boron-implanted layer, 13 and the phosphorus-implanted layer 20 are formed, the oxide film 15 is removed by performing the backside coating (formation of a resist film 57) and the wet etching processes in this order (process steps 42, 43 in FIG. 17) as shown in FIG. 16G. This results in dimensional change of the solid mark 7, in which width d' is further widen to width d''. After the resist film 57 formed in the backside coating is removed and the wafer is cleaned (process steps 44, 45 in FIG. 17), a second silicon epitaxial layer 22 is grown in vapor phase on the epitaxial layer 3 (process step 46 in FIG. 17). The boron-implanted layer 13 and the phosphorus-implanted layer 20 are thus converted into a buried boron-implanted layer 13' and the buried phosphorus-implanted layer 20', respectively. Similar process steps repeated hereinafter in a similar manner can provide a structure in which the buried boron-implanted layers, the epitaxial layers and the buried phosphorus-implanted layers are alternately stacked. Thereafter one more process steps for forming the top epitaxial layer are additionally performed in order to bury the lastly formed boron-implanted layer 13 and the phosphorus-implanted layer 20.

In the foregoing referential technique, the solid mark 7 once formed by the formation and removal processes of the oxide film is repetitively exposed to other formation and removal processes of the oxide film, so that the solid mark 7 is deformed since the surface portion of the epitaxial layer having such solid mark 7 formed thereon is lost by conversion into an oxide film or removal. When a new epitaxial layer 22 is grown in vapor phase on such deformed solid mark 7, the resultant mark 7' is such that being slightly relieved on the surface of the epitaxial layer 22, but is marginal in terms of its availability for a precise alignment. So that it is necessary to newly form a solid alignment mark in every process cycle on the surface of every epitaxial layer 22 at a position not overlaps the mark 7'. According to FIG. 17, entire processes from 1 to 45, which include those for forming the solid mark (process steps 3 to 14) must be repeated for every formation of a buried layer, and the production of a six-layered structure, for example, requires a total number of processes of as huge as 271. Moreover, a single cycle include 6 process steps for the oxide film formation (process steps of 3, 11, 16, 24, 31 and 39), 6 process steps for the backside coating (process steps 7, 12, 20, 27, 35 and 42), and 6 process steps for the wet etching of the oxide film (process steps 8, 13, 21, 28, 36 and 43). That is, only process steps related to the oxide film formation and derivative operations total 18 process steps out of 45 process steps, which expands to 108 process steps out of 271 process steps when the cycle is repeated 6 times. This clearly shows that a huge number of process steps are dedicated for the formation and removal of the oxide film.

Figure 6A:
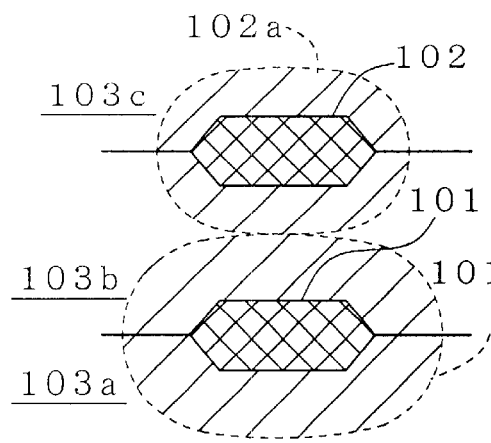
FIGS. 6A to 6D are schematic sectional views showing a buried layer formed by the production method according to a referential technique, and a vertical doped region derived therefrom.
Figure 6B:
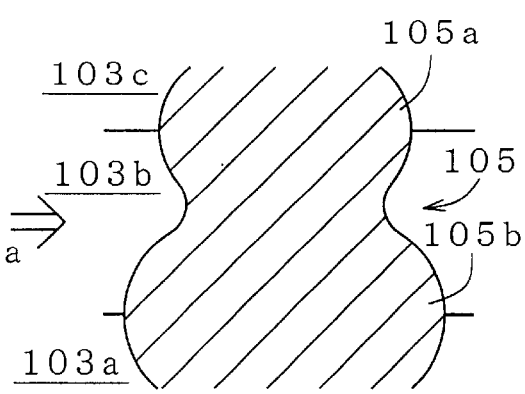
Figure 6C:
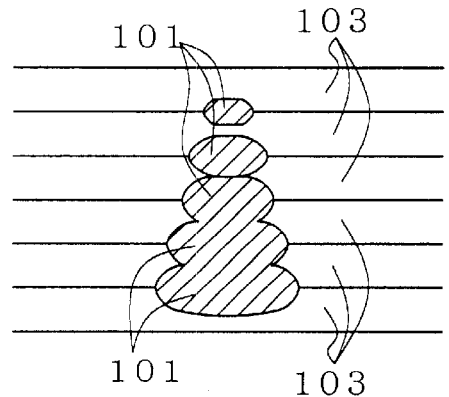
Figure 6D:
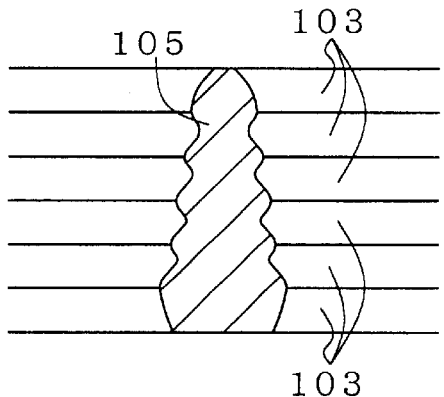

The foregoing process steps 1 to 45 also include 4 process steps for the formation of the thermal oxide film to be patterned (process steps 3, 11, 16 and 31), 2 process steps for the pre-implantation oxidation (process steps 24 and 39), and 2 process steps for the crystallinity recovery/activation annealing (process steps 26 and 41). That is, total 8 process steps causative of thermal history affecting the wafer are included. Thus when a pair of the boron-implanted layer 13' and the phosphorus-implanted layer 20' is repetitively formed 6-fold, the lowermost implanted layers will cumulatively be affected by thermal history 40 (=8×5) times when only the thermal history ascribable to the formation of successive 5 pairs is taken into account. As a result, as has been described in the above referring to FIG. 6C, the buried layer 101 in a lower position causes a larger expansion due to thermal diffusion, which makes the degree of expansion non-uniform both in the vertical and lateral directions. This further results in, as shown in FIG. 6D, the vertical doped region 105, obtained by vertically joining such buried layers 101, having a diameter growing toward the bottom.

This is the end of Referential Technical Example.
(Embodiment 1)

An embodiment of the present invention will be described referring to FIGS. 1A to 4B. FIG. 3 is a process flow chart showing an exemplary case forming 6 buried layers.

Figure 1A:
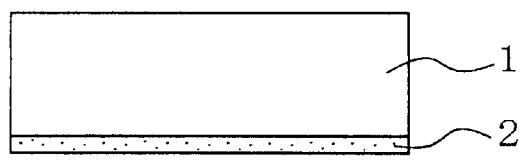
FIGS. 1A to 1G are schematic views showing process steps of an embodiment according to the first aspect of the present invention.
Figure 1B:
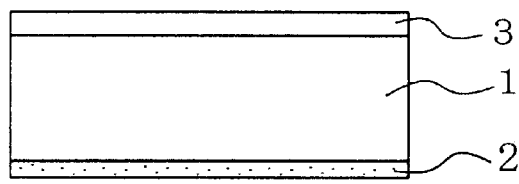

First as shown in FIG. 1A, a silicon single-crystalline substrate 1 having on the backside thereof a backside oxide film 2 formed typically by the CVD process is obtained. Next, as shown in FIG. 14B, an n⁻-type first silicon epitaxial layer 3 is grown in vapor phase on the major front surface of such silicon single-crystalline substrate 1 (process step 1 in FIG. 3). The process steps and conditions are entirely the same with those for the foregoing Referential Technical Example.

Figure 1C:
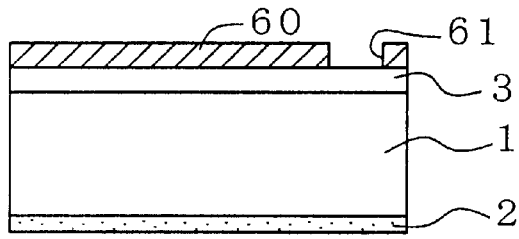
Figure 1D:
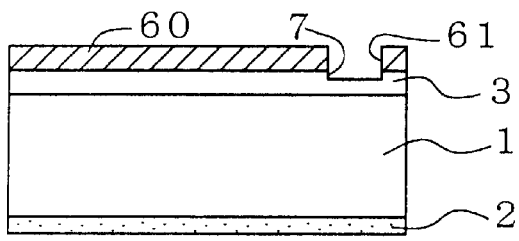

Next, as shown in FIG. 1C, a photoresist film 60 (thickness: approx. 1.2 μm, for example) for forming a solid alignment mark is formed. A pattern for the solid alignment mark is copied on the photoresist film 60 by the light exposure and development processes, to thereby form a pattern opening 61 and form a mask for forming the solid mark (process steps 2 to 4 in FIG. 3). The first solid alignment mark now can be aligned using an orientation flat or notch previously formed to the silicon single-crystalline substrate 1. Then as shown in FIG. 1D, the wafer in such state is subjected to dry etching, by which a recess as the solid mark 7 is formed at the position corresponded to the pattern opening 61 (process steps 5 in FIG. 3, depth: approx. 200 to 300 nm, for example). The dry etching can be performed by, for example, reactive ion etching. The photoresist 60 is then removed (process step 6 in FIG. 3).

While the foregoing Referential Technical Example 1 requires 13 process steps (process steps 2 to 14 in FIG. 17) for the formation of the solid alignment mark, the Embodiment of the present invention requires only 5 process steps (process steps 2 to 6 in FIG. 3). The reason for such simplification resides in that the formation of the mark-patterning oxide film is no more required, and thus all of the relevant processes for cleaning, backside coating and oxide film etching can be excluded; and that the formation of the mark-forming oxide film is no more required, and again all of the relevant processes for cleaning, backside coating and oxide film removal can be excluded.

Now back to FIGS. 1A to 1G, the wafer is cleaned (process step 7 in FIG. 3), and on the exposed first epitaxial layer 3, without intentionally forming an oxide film, a photoresist film is directly coated (process step 8 in FIG. 3, thickness: 1.2 μm, for example, positive photoresist). The photoresist film is then subjected to the pattern alignment using the foregoing solid mark 7, light exposure and development in order to form a pattern opening 63 through which boron (B) as a first impurity is implanted, to thereby complete a first ion implantation mask 62 (process steps 9 and 10 in FIG. 3).

Figure 1E:
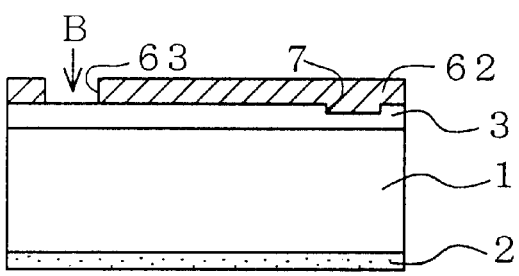
Figure 1F:
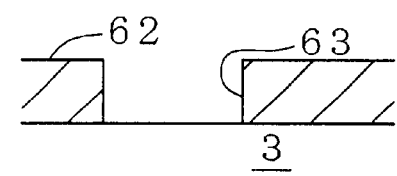
Figure 1G:
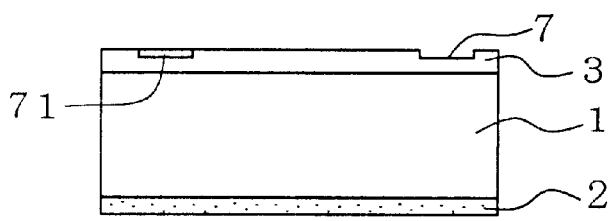

The wafer having such first ion implantation mask 62 formed thereon is then subjected to the ion implantation of boron based on same conditions with Referential Technical Example 1, which results in the formation of a boron-implanted layer 71 as a first ion-implanted layer in the epitaxial layer 3, more specifically in a first region exposed in the pattern opening 63 as shown in FIG. 1E (process step 11 in FIG. 3). The first ion implantation mask 62 is then removed (FIG. 1G, process step 12 in FIG. 3). The pattern opening 63 formed herein by processing the photoresist layer by the light exposure and development process has a sharp wall profile as shown in FIG. 1F, which is steeper than that obtained by the wet etching process (FIG. 15E). Such profile is beneficial in suppressing the non-uniformity in the resultant area of the boron-implanted layer 71.

While the foregoing Referential Technical Example 1 requires 12 process steps (process steps 15 to 26 in FIG. 17) for the formation of the boron-implanted layer 71 including those for the crystallinity recovery/activation annealing, the Embodiment of the present invention requires only 6 process steps (process steps 7 to 12 in FIG. 3). The reason for such simplification resides in that the ion implantation mask does not employ the oxide film and that the pre-implantation oxidation is not performed, so that the method no more requires both oxidation processes and the relevant process steps for cleaning, backside coating and oxide film removal.

Figure 2A:
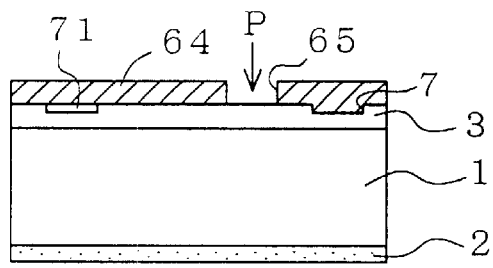
FIGS. 2A to 2F are schematic views showing process steps as continued from FIG. 1G.
Figure 2B:
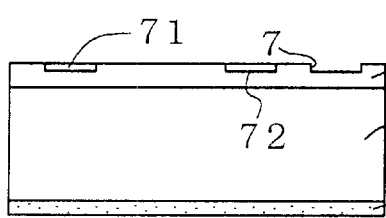
Figure 3:
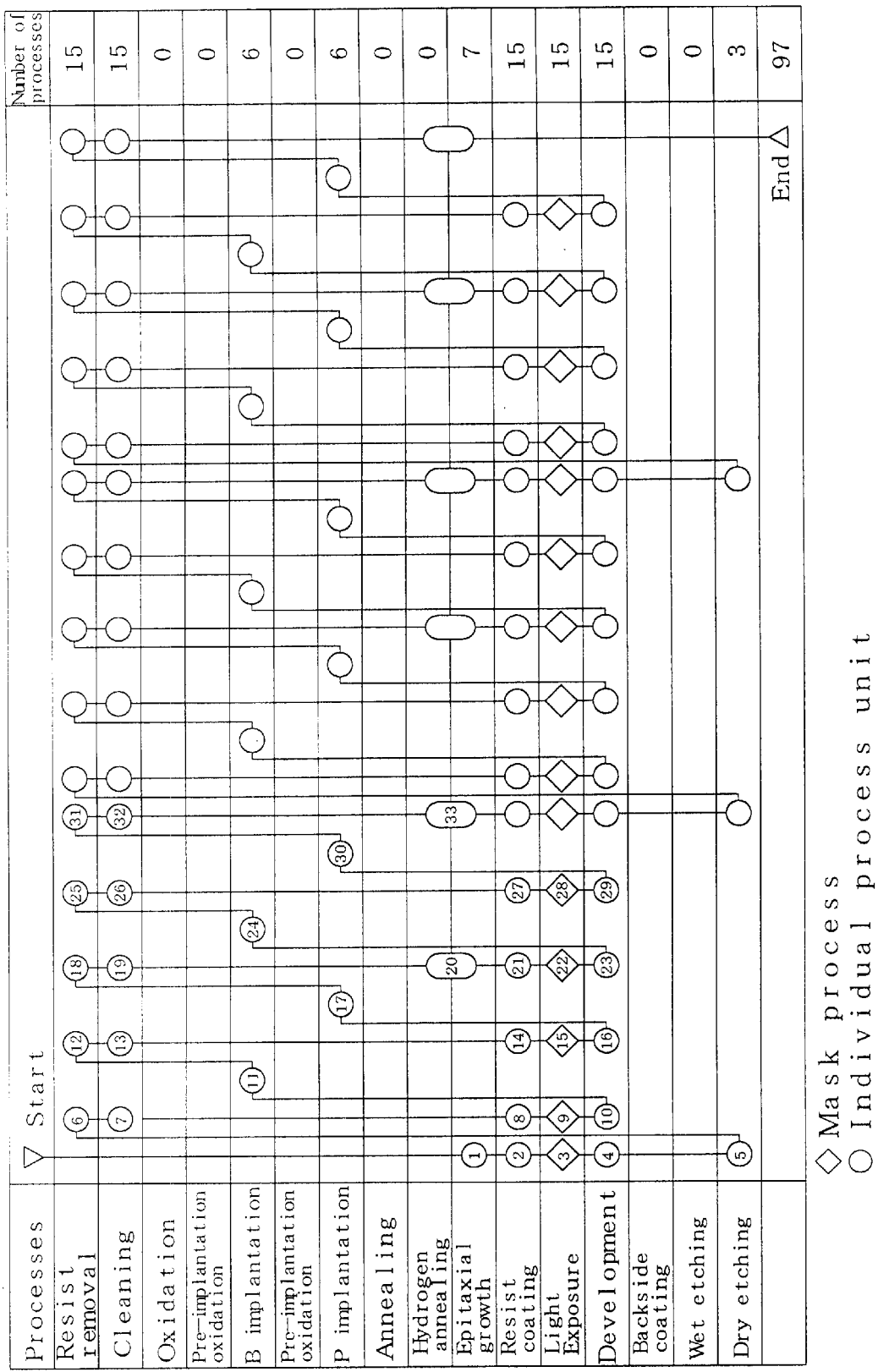
FIG. 3 is a process flow chart showing an exemplary case forming 6 buried layers according to the above embodiment.

After the boron-implanted layer 71 is formed, the wafer is cleaned (process step 13 in FIG. 3), and a photoresist is coated directly on the exposed first epitaxial layer 3 as shown in FIG. 2A without performing the crystallinity recovery/activation annealing nor intentionally forming an oxide film (process step 14 in FIG. 3). The obtained photoresist film is then subjected to the pattern alignment using the foregoing solid mark 7, light exposure and development in order to form a pattern opening 65, through which phosphorus (P) as a second impurity is implanted, at a position which differs from that the pattern opening 63 (FIG. 1E) for implanting boron was formed, to thereby complete a second ion implantation mask 64 (process steps 15 and 16 in FIG. 3). The wafer having such second ion implantation mask 64 formed thereon is then subjected to the ion implantation of phosphorus based on same conditions with Referential Technical Example 1, which results in the formation of a phosphorus-implanted layer 72 as a second ion-implanted layer in the epitaxial layer 3, more specifically in a second region exposed in the pattern opening 65 (process step 17 in FIG. 3). The second ion implantation mask 64 is then removed (FIG. 2B, process step 18 in FIG. 3).

While the foregoing Referential Technical Example 1 requires 15 process steps (process steps 27 to 41 in FIG. 17) including those for the removal by etching of the oxide film and the crystallinity recovery/activation annealing, the Embodiment of the present invention requires only 6 process steps (process steps 13 to 18 in FIG. 3) since, similarly to the case of forming the boron-implanted layer, the process steps related to the oxide film formation/removal are omissible.

Figure 2C:
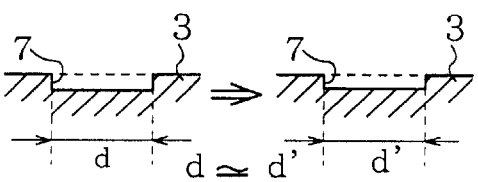
Figure 2D:
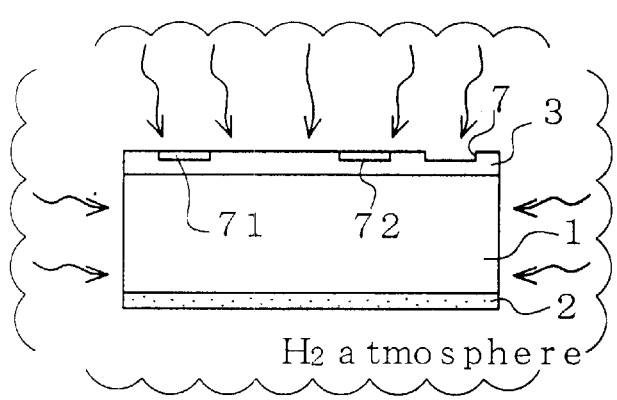

The wafer is cleaned (process step 19 in FIG. 3), and then subjected to the crystallinity recovery/activation annealing as shown in FIG. 2D. The annealing is proceeded, as shown in FIG. 4A, by placing the wafer in the vapor-phase growth apparatus 121, and by introducing hydrogen gas therein immediately before starting the vapor-phase growth of the second epitaxial layer 22 (FIG. 2F) (process step 20 in FIG. 3). Such annealing in the hydrogen atmosphere is efficient since the annealing can serve as that for removing native oxide film on the surface of the wafer, which is generally provided before the vapor-phase growth.

Figure 13:
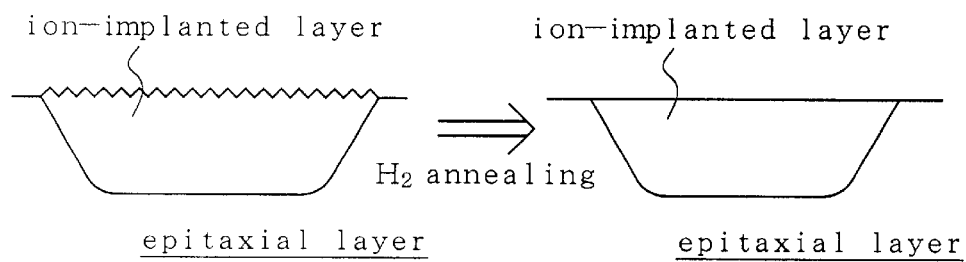
FIG. 13 is a schematic view showing effect of hydrogen annealing.

Proceeding the crystallinity recovery/activation annealing in such hydrogen atmosphere allows the ion-implanted layer to be less causative of surface roughening and to reduce the degree of roughening as shown in FIG. 13 despite the oxide film is not intentionally formed before the ion implantation. As has been repetitively explained, largest contribution to the simplification of the processes is given by omission of the oxide film formation/removal, and it can be said that an essential factor that ensures the omission of the oxide film formation is such achievement of the prevention of the surface roughening by virtue of the hydrogen annealing.

Further simplification of the process is also attained by performing the crystallinity recovery/activation annealing in a hydrogen atmosphere simultaneously both for the boron-implanted layer 71 and the phosphorus-implanted layer 72, while in the Referential Technical Example 1 such annealing was separately performed for the boron-implanted layer 13 and the phosphorus-implanted layer 20.

The process temperature in such annealing in a hydrogen atmosphere is preferably 700° C. or above. The process temperature lower than 700° C. will result in insufficient crystal recovery and activation of the ion-implanted layer. The process temperature is more preferably adjusted within a range from 850 to 1,100° C. If the process temperature is lower than 850° C., the native oxide grown on the wafer surface is hardly etched even with hydrogen. On the other hand, the process temperature exceeding 1,100° C. will result in increased impurity diffusion of the ion-implanted layer to a level which is not ignorable. While a satisfiable preventive effect on the surface roughening can be obtained when the annealing in a hydrogen atmosphere is proceeded under the normal pressure, it is also allowable to proceed such annealing in a hydrogen atmosphere under reduced pressure (approx. 20 to 760 Torr, for example) insofar the preventive effect on the surface roughening is not ruined.

Figure 2E:
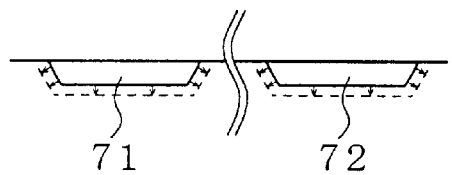
Figure 2F:
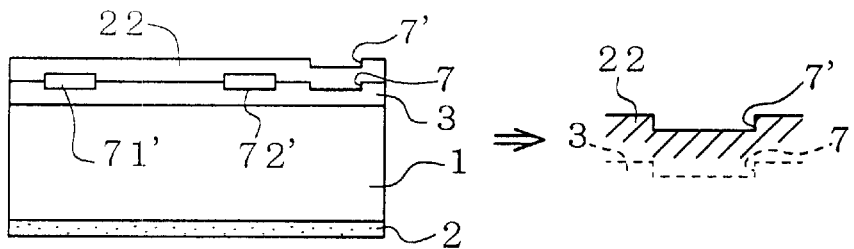

Upon completion of such annealing in the hydrogen atmosphere, the vapor-phase growth process is then proceeded in a successive manner in the vapor-phase growth apparatus 121 while supplying trichlorosilane ($SiHCl_3$) as a source gas SG as shown in FIG. 4B, to thereby form the second epitaxial layer 22 as shown in FIG. 2F, and to thereby convert the boron-implanted layer 71 and the phosphorus-implanted layer 72 as a first and a second ion-implanted layers, respectively, into a boron-buried layer 71' and a phosphorus-buried layer 72' as a first and a second buried layers, respectively (process step 20 in FIG. 3). Since the annealing process in the hydrogen atmosphere and the vapor-phase growth process for forming the second epitaxial layer are performed as a series process (practically a single process), further simplification of the process as a whole can be achieved.

The vapor-phase growth process is preferably proceeded in a stepwise manner in order to suppress the lateral auto-doping from the boron-implanted layer 71 and the phosphorus-implanted layer 72, in which a thin epitaxial layer for capping is first grown in vapor phase (so-called cap deposition), which is followed by the main growth of the second epitaxial layer 22.

Figure 5A:
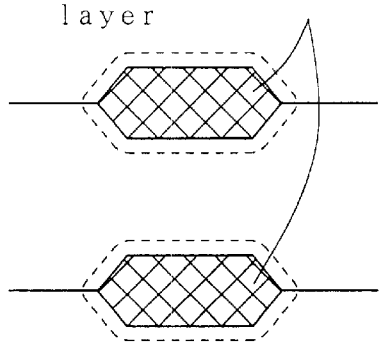
FIGS. 5A and 5B are schematic sectional views showing a buried layer formed by the production method according to the first aspect, and a vertical doped region derived therefrom.
Figure 5B:
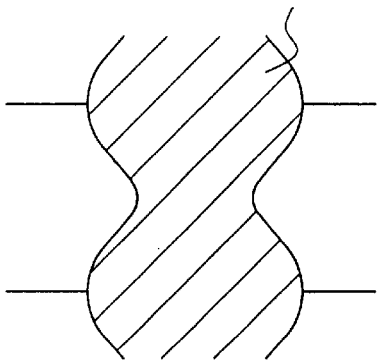

Thus one cycle starts with the formation of the solid mark on the epitaxial layer and ends with the formation of one boron-buried layer 71' and one phosphorus-buried layer 72' completes. As is clear from FIG. 3, the number of process steps within one cycle is 19 (process steps 2 to 20), which is reduced to less than half of that in Referential Technical Example 1 using the oxide layer as the ion implantation mask (45 process steps). While Referential Technical Example 1 includes 8 process steps causative of thermal history exerted on the wafer, Embodiment 1 of the present invention includes only one process, which is for the epitaxial growth. So that, as shown in FIG. 2E, thermal diffusion of the ion-implanted layers (boron-implanted layer 71 and phosphorus-implanted layer 72) possibly occurs during one cycle for forming one buried layer is considerably suppressed as compared with that in Referential Technical Example 1. Thus as shown in FIGS. 5A and 5B, the vertically-aligned buried layers have degrees of lateral expansion only lightly differ with each other and separated in the vertical direction. Therefore, the vertical doped region (also referred to as "vertical impurity-doped region") formed by joining the vertically-aligned buried layers by the diffusion annealing after a plurality of epitaxial layers are stacked will have a more uniform sectional area in the stacking direction.

Figure 7:
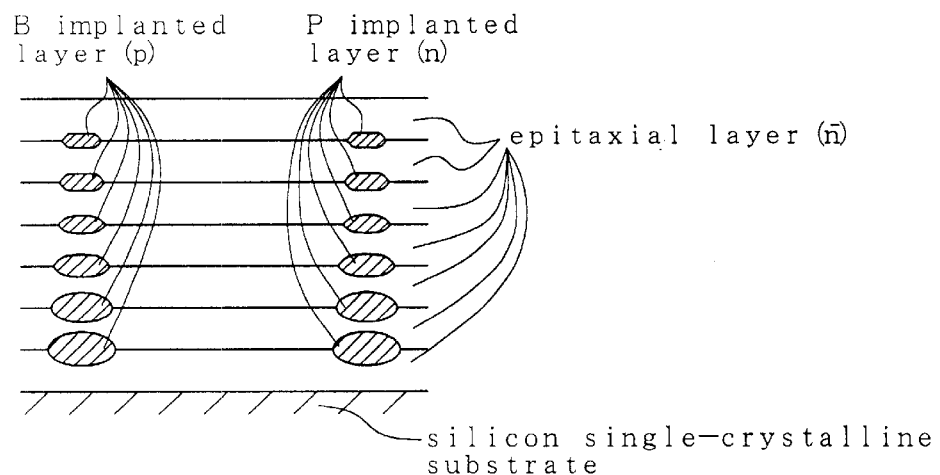
FIG. 7 is a schematic sectional view showing an epitaxial layer of the present invention having multiple buried layers.
Figure 8:
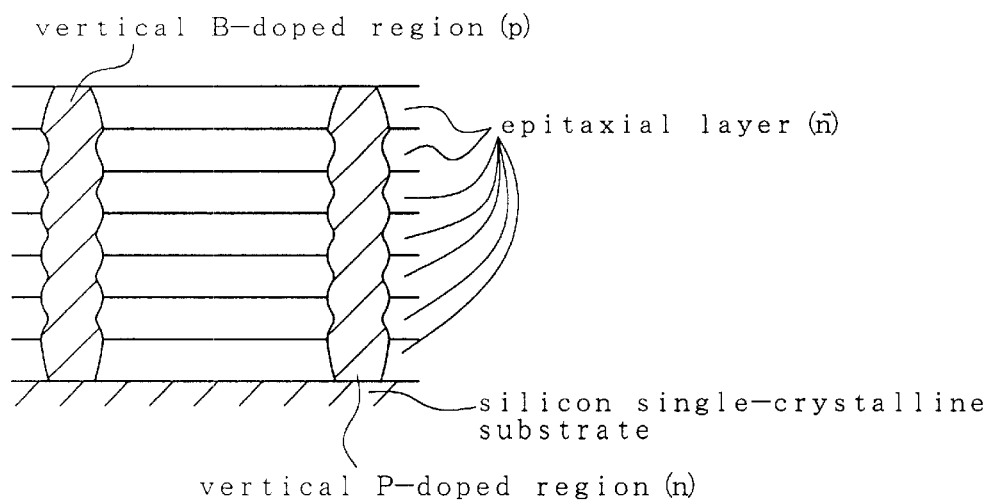
FIG. 8 is a schematic sectional view showing vertical doped regions obtained by annealing the epitaxial wafer shown in FIG. 7.

FIG. 7 is a schematic sectional view showing an essential part of a silicon epitaxial wafer obtained by the production method of Embodiment 1. Between each adjacent epitaxial layers, the p-type boron-buried layer as a first buried layer and the n-type phosphorus-buried layer as a second buried layer are formed individually in the same regions. All of the boron-buried layers and the phosphorus-buried layers individually aligned in the stacking direction of the epitaxial layers are formed while being individually separated with $n^-$-type epitaxial layers. If such epitaxial wafer is subjected to the diffusion annealing, the boron-buried layers and the phosphorus-buried layers composing the impurity-doped regions are individually joined in the vertical direction to thereby produce the vertical boron-doped region and the vertical phosphorus-doped region as shown in FIG. 8. These vertical doped regions are considerably improved in the uniformity of the sectional area in the stacking direction as compared with that obtained by the referential technology shown in FIG. 6D.

Figure 10A:
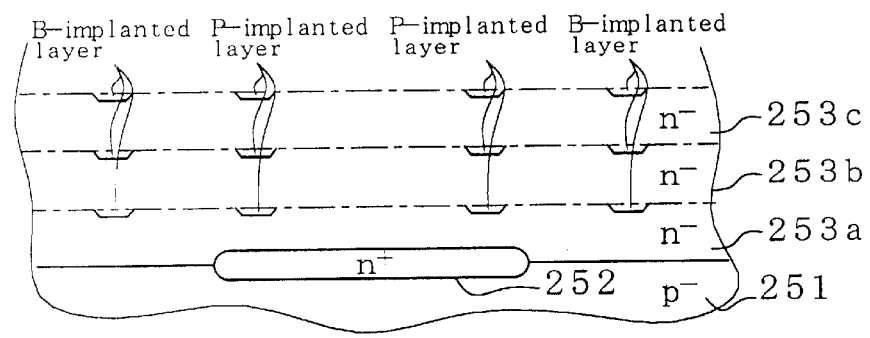
FIGS. 10A and 10B are schematic sectional views showing an exemplary epitaxial wafer produced by the present invention.
Figure 10B:
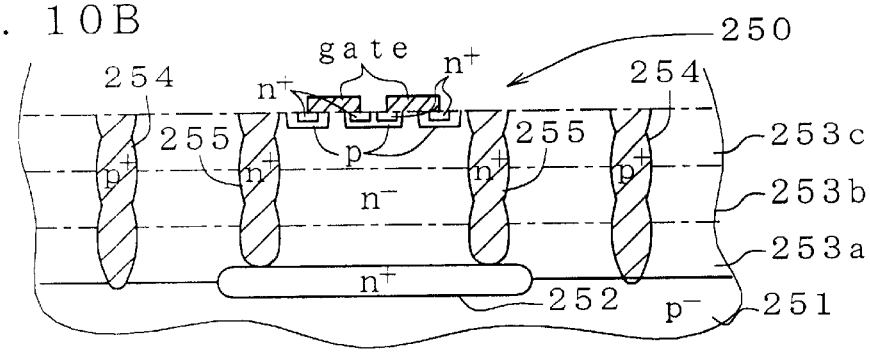

FIG. 10A shows an exemplary case that the production method of the present invention is applied to the production of an epitaxial wafer for fabricating MOSFET devices. In this drawing, a plurality of $n^-$-type epitaxial layers 253a to 253c are stacked on a $p^-$-type silicon single-crystalline substrate 251, in which an $n^+$-type buried layer 252 is formed between the substrate 251 and the lowermost epitaxial layer 253a, and a boron-implanted layer and a phosphorus-implanted layer, both having a ring shape, are buried between every adjacent epitaxial layers 253a to 253c while being separated in the vertical direction. In FIG. 10A, a series of the boron-implanted layers vertically aligned are formed so as to surround the outer periphery of the buried layer 252. On the other hand, a series of the phosphorus-implanted layers vertically aligned are formed so as to overlap with the buried layer 252 when viewed in a projection on a virtual plane normal to the stacking direction of the epitaxial layers 253a to 253c. When such wafer is subjected to the diffusion annealing, the boron-implanted layers are joined to produce a hollow cylindrical $p^+$-type device isolation region 254 as a vertical boron-doped region, and the phosphorus-implanted layers are joined to produce a hollow cylindrical $n^+$-type drain region 255 (electrically connected to the buried layer 252) as a vertical phosphorus-doped region, as shown in FIG. 10B. FIG. 10B shows an exemplary state in which p-type wells, n-type source regions and a gate electrode are formed inside the drain region 255 to thereby compose an n-channel MOSFET device.

Figure 11A:
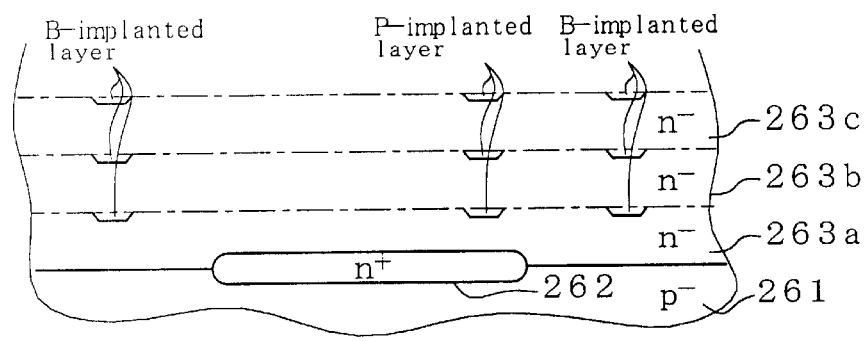
FIGS. 11A and 11B are schematic sectional views showing another embodiment of the same.
Figure 11B:
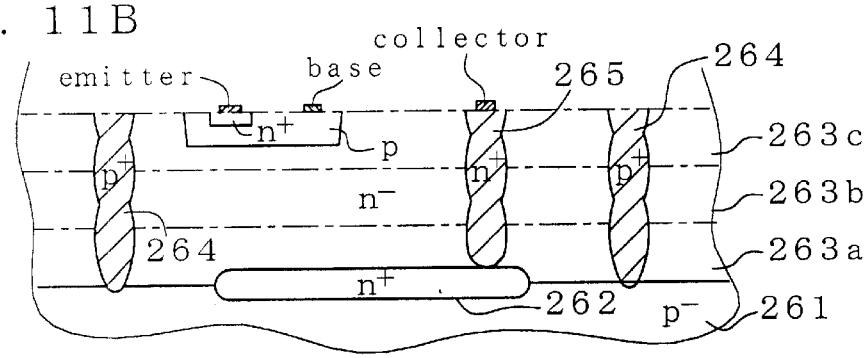

On the other hand, FIG. 11A shows an exemplary case that the production method of the present invention is applied to the production of an epitaxial wafer for fabricating bipolar devices. In this drawing, a plurality of $n^-$-type epitaxial layers 263a to 263c are stacked on a $p^-$-type silicon single-crystalline substrate 261, in which an $n^+$-type buried layer 262 is formed between the substrate 261 and the lowermost epitaxial layer 263a, and a ring-shaped boron-implanted layer and a disk-shaped phosphorus-implanted layer are buried between every adjacent epitaxial layers 263a to 263c while being separated in the vertical direction. When such wafer is subjected to the diffusion annealing, the boron-implanted layers are joined to produce a hollow cylindrical p$^+$-type device isolation region 264 as a vertical boron-doped region, and the phosphorus-implanted layers are joined to produce a columnar n$^+$-type collector region 265 as a vertical phosphorus-doped region, as shown in FIG. 11B. FIG. 11B shows a state in which a p-type base region and an n-type emitter region are formed inside the device isolation region 264 to thereby compose an npn-type bipoler device.

Although FIGS. 10A, 10B and FIGS. 11A, 11B showed exemplary cases of the production method of semiconductor devices using p$^-$-type silicon single-crystalline substrate, the production method and the silicon epitaxial wafer obtained thereby according to the present invention are by no means limited thereto, and are also applicable to those using a p$^+$-type silicon single-crystalline substrate, and, of course, also to those using an n-type silicon single-crystalline substrate.

(Embodiment 2)

Next, an embodiment according to the second aspect will be explained.

As shown in FIGS. 1A to 1G and FIGS. 2A to 2F, the solid mark 7 (transfer source solid alignment mark) on the first epitaxial layer 3 well keeps the shape even after one process cycle for forming one buried layer is completed (FIG. 2C). Thus, when the second epitaxial layer 22 is stacked thereon, the profile of such lower solid mark 7 is copied thereto in a relieved manner as shown in FIG. 2F without being seriously deformed. This allows the copied mark to be used as a new solid alignment mark 7' (that is, available as a copied solid mark), when the process cycle of the ion implantation and the vapor-phase growth is repeated while assuming the second epitaxial layer 22 as a new first epitaxial layer.

Figure 9A:
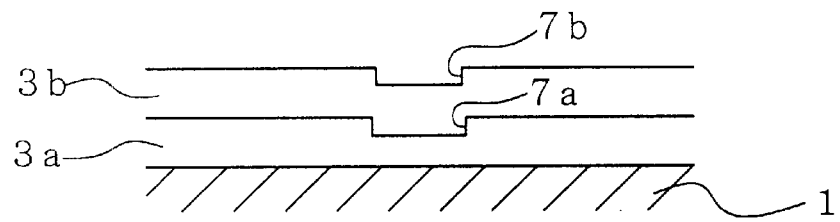
FIGS. 9A to 9C are schematic views showing features of the second aspect of the present invention.
Figure 9B:
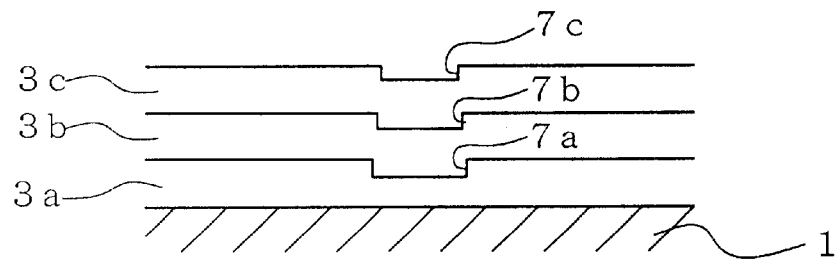
Figure 9C:
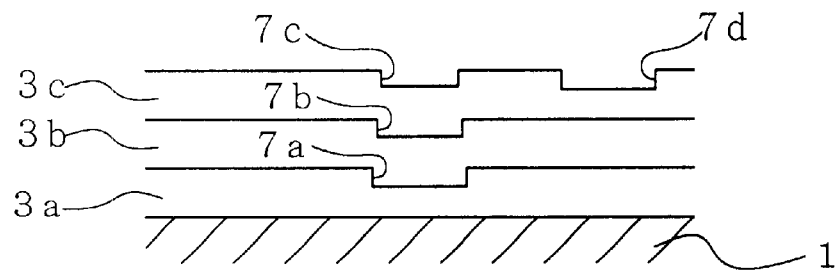

Hence in the process cycle for forming the second boron-buried layer and the phosphorus-buried layer, the steps for forming the solid mark (process steps 2 to 7 in FIG. 3) are omissible, which ensures further simplification of the process. In the thus-obtained epitaxial wafer, the solid mark not being derived from the a solid alignment mark on the underlying epitaxial layer but can serve as a source pattern for forming copied solid marks for the successive epitaxial layers is formed only a part of the layers including the lowermost layer from those stacked with each other while having therein the buried layers. In FIG. 3, the first cycle including steps for forming the solid mark comprises 19 process steps (process steps 2 to 20), whereas the second cycle in which the solid mark is not formed comprises only 13 process steps (process steps 21 to 33) saving 6 process steps. For the case a plurality of epitaxial layers and buried layers are formed, it is allowable to perform the first cycle only for the first one layer, and repeat the second cycles for the successive layers. Depending on the thickness of the epitaxial layer, it is also allowable, as shown in FIGS. 9A to 9C, to abandon the use of a solid mark 7b (FIG. 9A) and 7c (FIG. 9B) relieved over the solid mark 7a on the first layer, and to form a new solid mark 7d in a new region (FIG. 9C). This allows the solid alignment marks to appear on the uppermost layer from the epitaxial layer having therein the buried layers only in a number smaller than the number of stacking of such epitaxial layers while keeping a positional relation by which the overlapping is avoidable. In such case, the solid mark 7a formed on the lowermost epitaxial layer 3a from a plurality of the epitaxial layers 3a to 3c, and the solid mark 7d on the epitaxial layer 3c, skipping one layer, can serve as a transfer source solid alignment mark.

For example in FIG. 3, the process is so designed to form a new solid mark for every two layers, which eventually repeats the first cycle and the second cycle alternately. In the above-described Embodiment of the present invention, the number of process steps finally required for forming 6 layers is 97, which is dramatically reduced to a level slightly larger than ⅓ in Referential Technical Example having total 271 process steps.

The foregoing process is also considered to be further advantageous in terms of keeping the morphology of the transfer source solid alignment mark, since there is employed a process not requiring the oxide film formation/removal throughout the formation of the boron-implanted layer 71 and the phosphorus implanted layer 72. However, the second aspect is also applicable to the case employing the pre-implantation annealing according to a usual practice without performing the annealing in a hydrogen atmosphere, since the thickness of the oxide film formed by such pre-implantation annealing is as small as approx. 50 nm.

Since a copied solid mark is directly available as a solid alignment mark for the relevant layer and the oxide film mask is not used in the foregoing process, so that, even when a plurality of ion-implanted layers differ in the conductivity type are formed in the same epitaxial layer according to predetermined patterns, a solid mark used for the mask alignment for the former ion-implanted layer pattern having a certain conductivity type can be used the mask alignment for the next ion-implanted layer pattern having another conductivity type. Therefore, only at least one solid alignment mark for the mask alignment will be sufficient irrespective of how many types of the patterns are formed in a single epitaxial layer. This provides one of major factors for reducing the number of formation of the solid alignment marks newly patterned, and also provides a new advantage that the number of the mask can sharply be reduced. Still another advantage resides in that the area occupied by the solid alignment marks on the major front surface of the epitaxial wafer can be reduced.

Referential Technical Example 2

In the foregoing process in Referential Technical Example 1 using the oxide film as the ion implantation mask, as shown in FIGS. 23A to 23D, the solid alignment mark 7 tends to deform with the progress of a single formation/removal of the oxide film used as the ion implantation mask, when the ion-implanted layers differing with each other in the conductivity type, which are typically the boron-implanted layer 71 and the phosphorus-implanted layer 72, are formed in the epitaxial layer 3. Thus, although on the same epitaxial layer 3, a solid alignment mark 7h for use in the pattern formation of the boron-implanted layer 71 and a solid alignment mark 7i for use in the pattern formation of the phosphorus-implanted layer 72 are separately formed, instead of forming a single solid alignment mark 7. When a new epitaxial layer 22 is stacked thereon, a new solid alignment mark is formed. In this case, such, new solid alignment mark is aligned using a copied solid mark formed on the upper epitaxial layer 22, which is copied from the solid mark 7 on the lower epitaxial layer 3. It is, however, difficult to ensure an alignment accuracy by using the solid marks 7h, 7i which has been deformed in association with the oxide film formation/removal, so that another solid alignment mark 7j is previously formed on the epitaxial layer 3 before the upper epitaxial layer 22 is formed. The solid alignment mark 7j is reflected on the upper epitaxial layer 22 as a solid alignment mark 7j' which is used for the formation of such new alignment mark. Thus a single epitaxial layer will have multiple, which is three in this case, solid alignment marks.

Figure 23A:
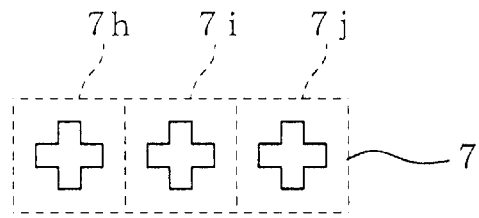
FIGS. 23A to 23D are views explaining problems in a conventional method for producing an epitaxial layer using a solid alignment mark.
Figure 23B:
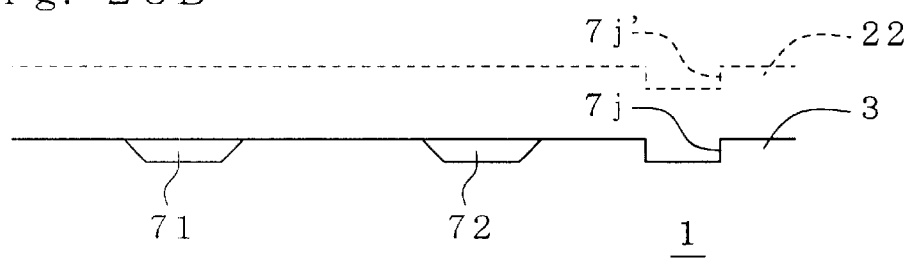
Figure 23C:
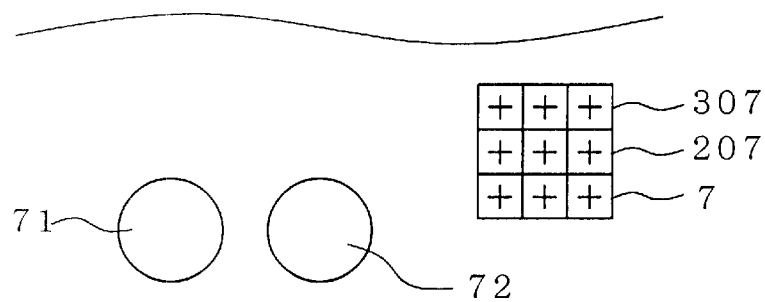
Figure 23D:
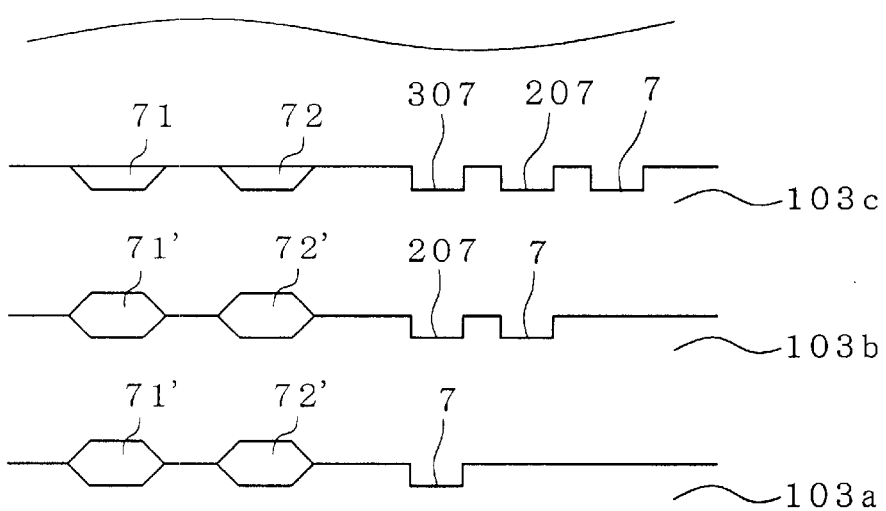

Since the shape of the a solid alignment mark in a lower epitaxial layer is recognizable from the top through the layers, it is always necessary to locate an upper solid alignment mark so as not to cause a positional overlapping with lower solid alignment marks. So that if a solid alignment mark is newly formed for each layer, the uppermost layer will have the solid alignment marks in a number equals to the number of the layers. For example, FIG. 23D shows an exemplary case in which three epitaxial layers 103a to 103c are formed while forming therein the buried layers 71', 72' or the ion-implanted layers 71, 72, in which the uppermost epitaxial layer 103c will have three sets of solid alignment marks, that are, the solid alignment mark 7 newly patterned on the epitaxial layer 103c; a copied solid mark 307 which is duplicated twice originated from the solid alignment mark 7 two layers below and mediated by a copied solid mark 207 on the intermediate epitaxial layer 103b; and a copied solid mark 207 based on the solid alignment mark 7 newly patterned on the intermediate epitaxial layer 103b. In particular for the case as shown in FIGS. 23B and 23C that a plurality of solid alignment marks are formed on a single epitaxial layer, the total number further increases. This undesirably result in that the uppermost epitaxial layer of the obtained epitaxial wafer will have solid alignment marks formed in a number far more larger than the number of the epitaxial layers ever formed, and in that a large space for accommodating such large number of solid alignment marks must be reserved.

Another problem arises in the case in which a plurality of buried layers of the same conductivity type are formed as being stacked at the same position as shown in FIG. 7, where a mask pattern for forming such ion-implanted layers may be common to all. The position of the solid alignment mark, however, must be altered for each layer, which eventually requires a large number of masks only differ in the position of patterns for the solid alignment marks while the pattern for the ion-implanted layers remain unchanged.

(Embodiment 3)

Figure 22A:
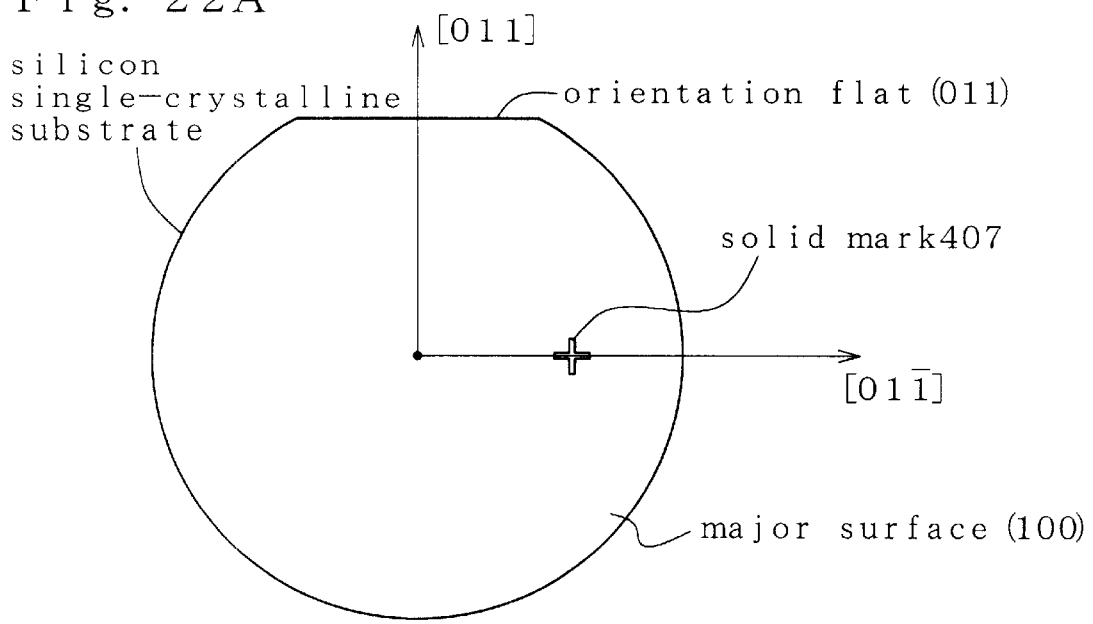
FIGS. 22A to 22C are views showing an exemplary deformation of the solid alignment mark due to growth of the epitaxial layer.
Figure 22B:
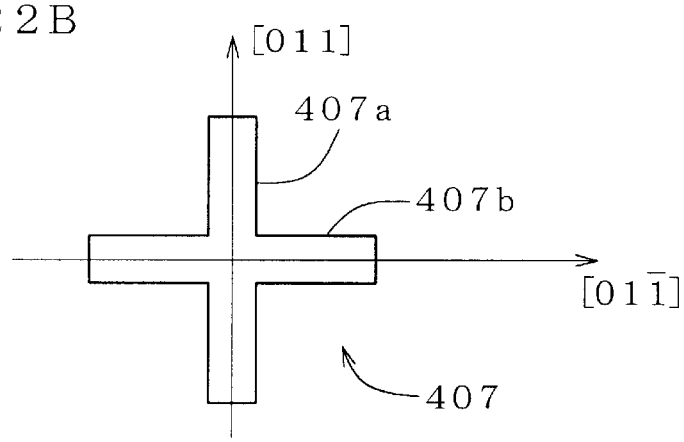
Figure 22C:
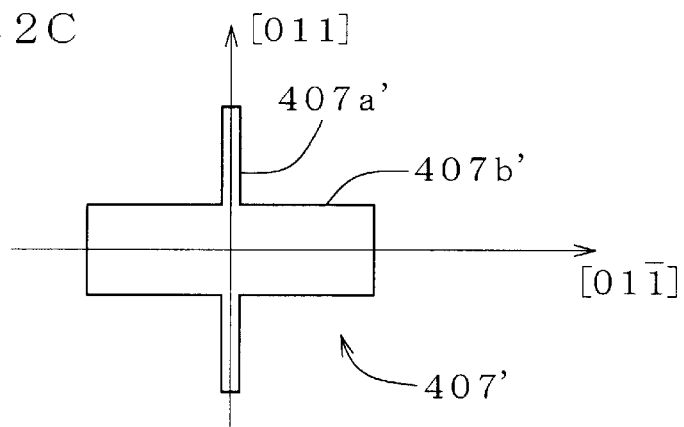

In order to ensure a morphological accuracy suitable for the alignment, it is important to take consideration on the morphology of the solid alignment mark which is less causative of deformation ascribable to the vapor-phase growth mechanism of silicon. FIGS. 22A to 22C show a silicon single-crystalline substrate having (100) crystal plane orientation, and a cross-shaped solid mark 407 having a straight portion 407a in the [011] direction and a straight portion 407b in the [01-1] direction crossed at the center. When such solid mark 407 is copied on the epitaxial layer formed thereon, an obtained copied solid mark 407' tends to deform such that being narrowed in the straight portion 407a' in the [011] direction, and widened in the straight portion 407b' in the [01-1] direction normal thereto.

Figure 18A:
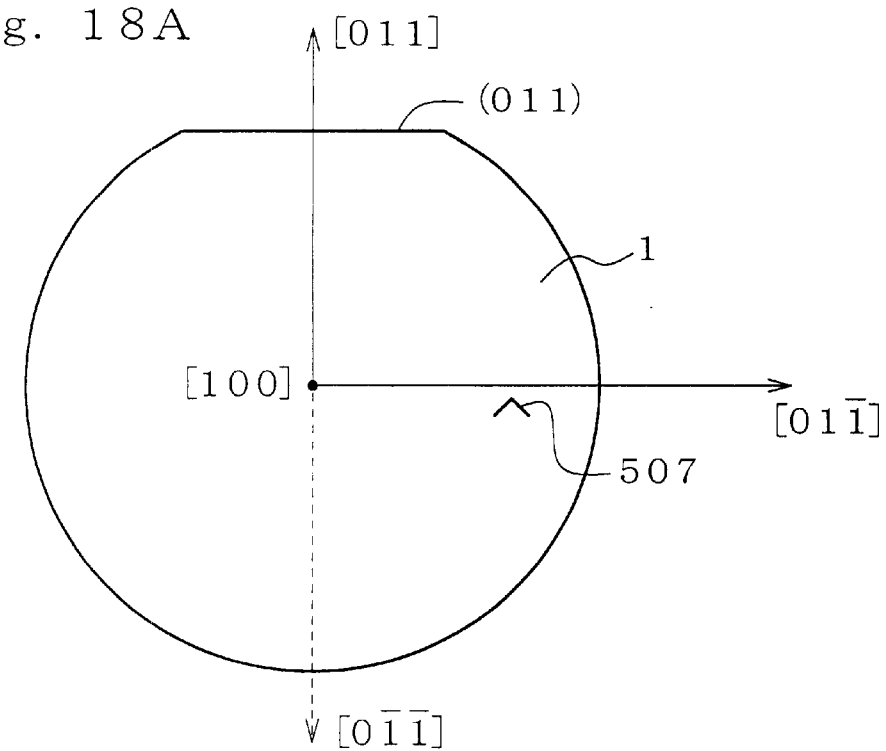
FIGS. 18A and 18B are schematic views showing one preferable embodiment of a solid alignment mark.
Figure 18B:
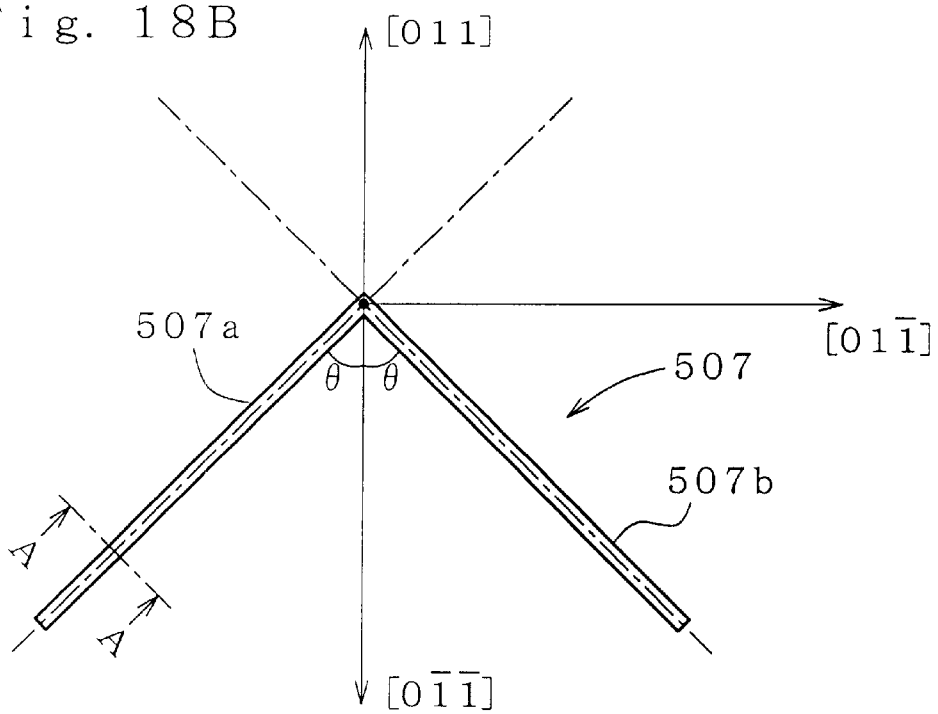
Figure 18C:
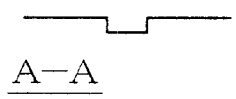
FIG. 18C shows cross section A—A of FIG. 18B.
Figure 19:
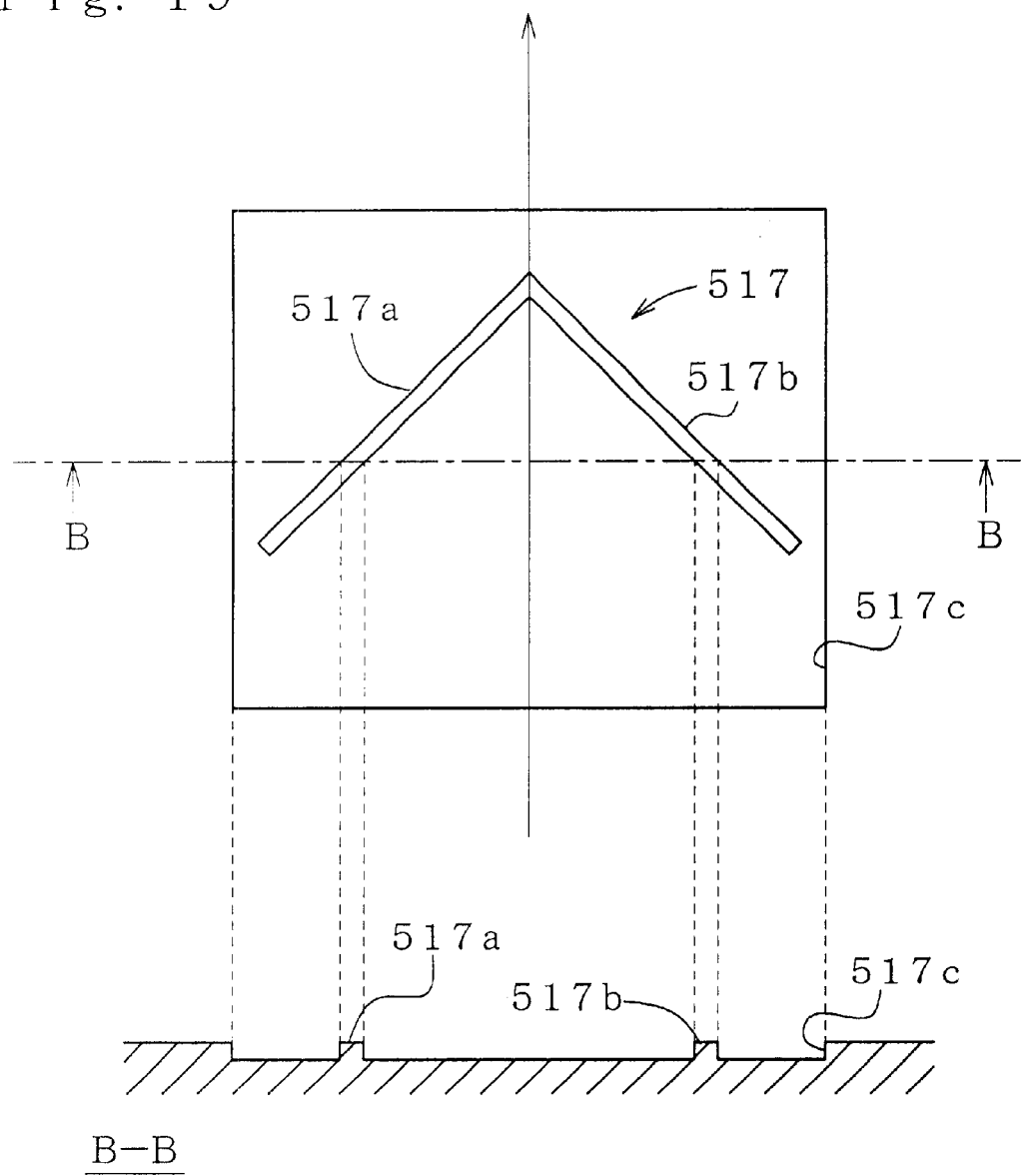
FIG. 19 is a schematic view showing a positional modification of the solid alignment mark shown in FIG. 18.
Figure 20:
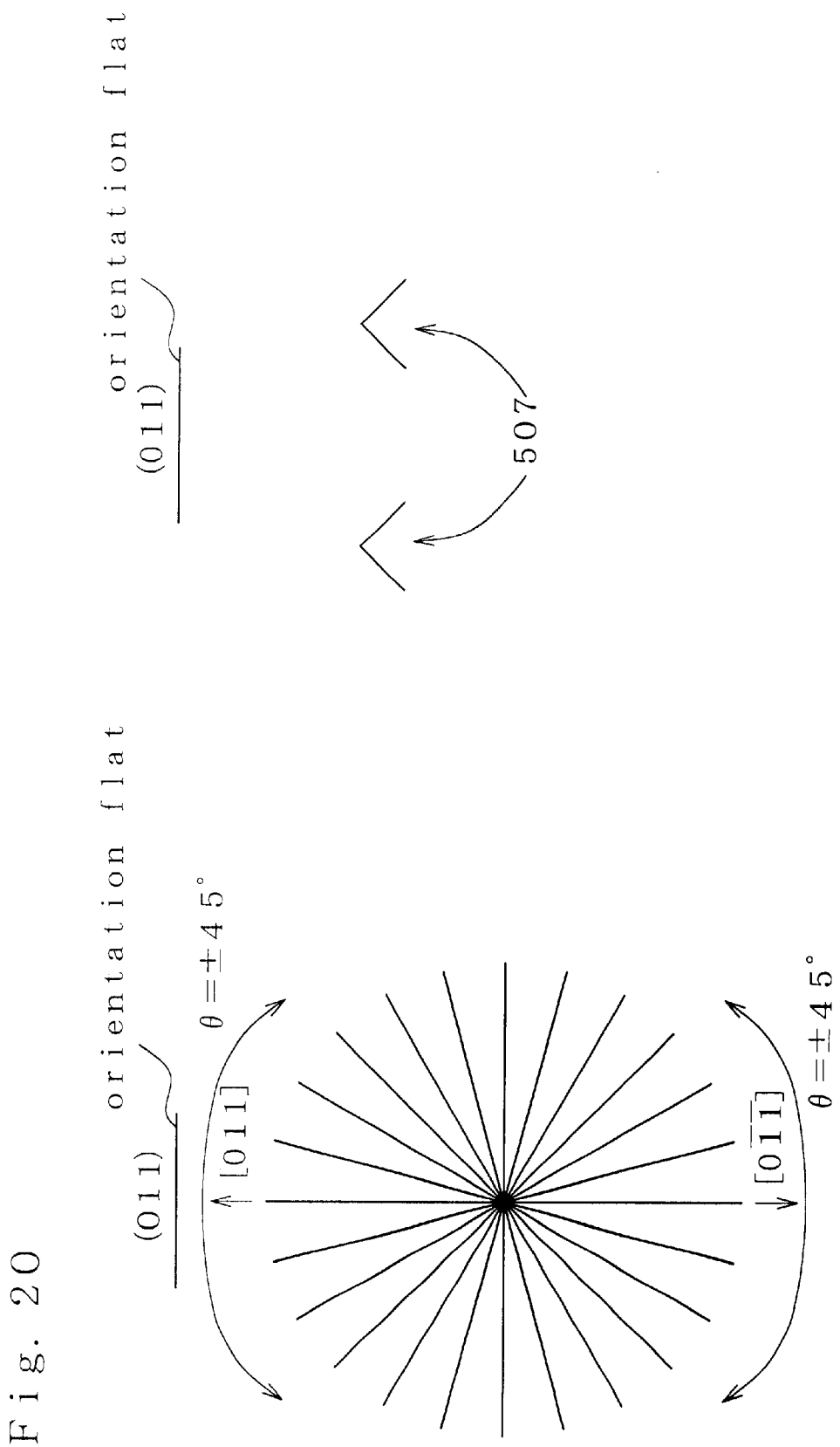
FIG. 20 is a chart showing a preferable angular range for a straight portion contained in the solid alignment mark.

The present inventors found out after extensive researches that, for the case that the epitaxial layer is grown on the silicon single-crystalline substrate having (100) crystal plane orientation, such deformation of the copied solid mark can effectively be suppressed if, as shown in FIG. 20, the solid alignment mark 507 is formed so as to have a straight portion aligned in a direction 45 degrees or less away from the [011] or [0-1-1] direction. FIGS. 18A and 18B show a specific embodiment of such solid alignment mark 507, in which two groove-shaped line patterns 507a, 507b (individually having a width of approx. 4 μm and a depth of approx. 0.2 μm, for example) are met at a right angle to thereby form an L-profile herein while holding one end point in common. It is now also allowable to form the solid mark in a ridge shape. The solid mark 517 in this case comprises a shallow recess 517c formed in the surface portion of the substrate, and two ridge-shaped line patterns 517a, 517b formed therein, which are met approximately at a right angle to thereby form an L-profile. The major front surface of the substrate may have an off-angle of as large as 4 degrees, where the crystal axis orientation in this case is assumed as approximately the same with that for substrate having no off-angle.

Experiments described below were conducted to confirm the above effects. A silicon single-crystalline substrate employed has [100] crystal axis orientation (no off-angle) and has an orientation flat with (011) crystal orientation as shown in FIG. 18A, and a solid mark 527 having a shape of a strait ridge with a 130 nm height and a 12 μm width shown in FIG. 21 was formed thereon. Here the longitudinal direction of the ridge of such solid mark 527 was set in a various direction ranging from θ=0° to θ=90°, which correspond to the [011] direction and the [01-1] direction, respectively. Next, using the vapor-phase growth apparatus 122 as shown in FIGS. 4A and 4B and trichlorosilane (SiHCl₃), an epitaxial layer was grown to a thickness of 24 μm on the major front surface having such solid mark 527 formed thereon at 180° C. under 80 Torr.

Figure 21:
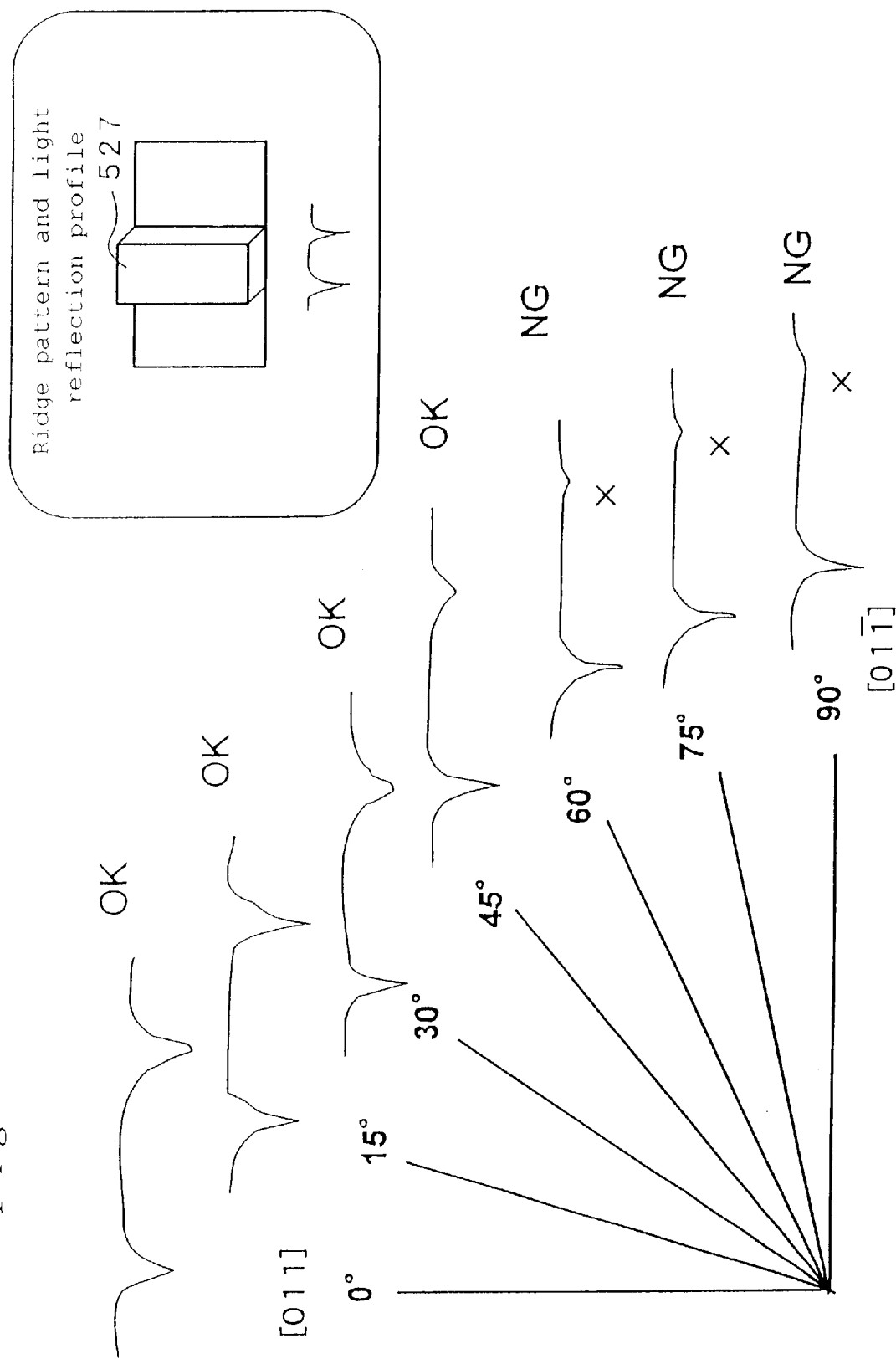
FIG. 21 is a chart showing experimental results supporting the angular range shown in FIG. 20.

Then on the substrate having the epitaxial layer formed thereon a negative photoresist was coated to a thickness of 0.8 μm, and a trial was made on the auto-alignment of a patterned mask with regard to the epitaxial wafer using a known aligner with the aid of such solid mark 527 as an alignment pattern. The auto-alignment is conducted by photoelectrically detecting the reflected light beams from the solid mark 527 formed on the epitaxial layer and from the pattern edge on the mask, and moving the epitaxial wafer and/or the mask in a relative manner so as to cancel the difference between the detected edge positions. FIG. 21 shows pattern position signal profiles measured at various θ values. It was made clear that, while θ exceeding 45 degrees extremely weakened the reflection peak ascribable to one edge to thereby disable the auto-alignment, θ of 45 degrees or less did not interfere the auto-alignment. This means that the copied solid mark on the epitaxial layer copied from the solid mark 527 tends to cause significant pattern deformation of either edge, where θ of 45 degrees or less can suppress such deformation to a level allowing the auto-alignment.

(Embodiment 4)

Next, an embodiment according to the third aspect will be explained. As has been described in the Embodiment according to the first aspect, the vapor-phase growth of the epitaxial layer is preferably proceeded in a two-step manner in order to suppress the lateral auto-doping from the boron-implanted layer and the phosphorus-implanted layer, in which a thin capping epitaxial layer is first grown (so-called cap deposition), which is followed by the main growth of the second epitaxial layer. This is in particular important from the viewpoint of preventing the lateral auto-doping of phosphorus from the phosphorus-implanted layer.

Figure 24A:
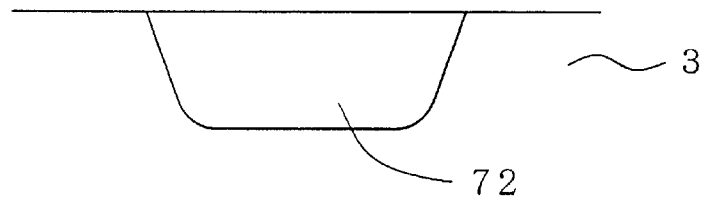
FIGS. 24A to 24D are views explaining effects of the third aspect.
Figure 24B:
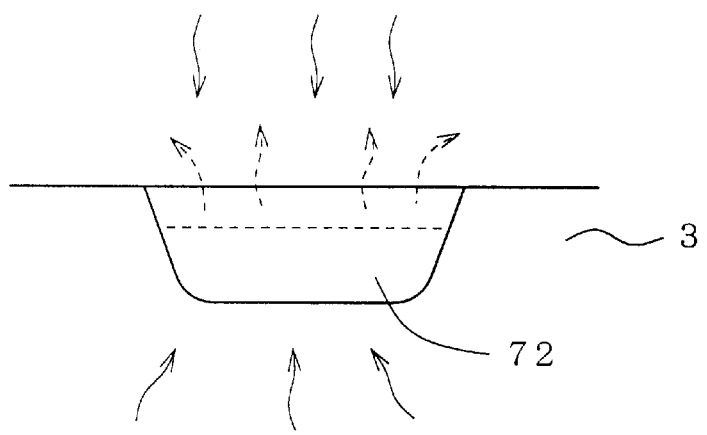
Figure 24C:
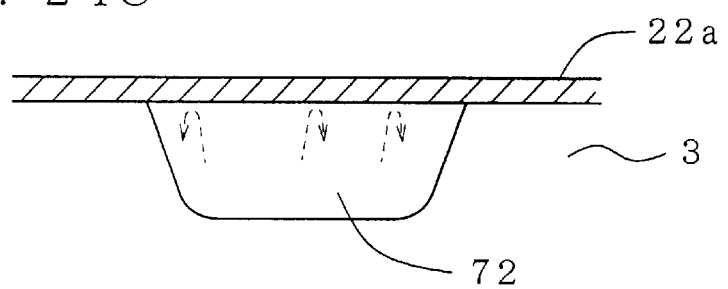
Figure 24D:
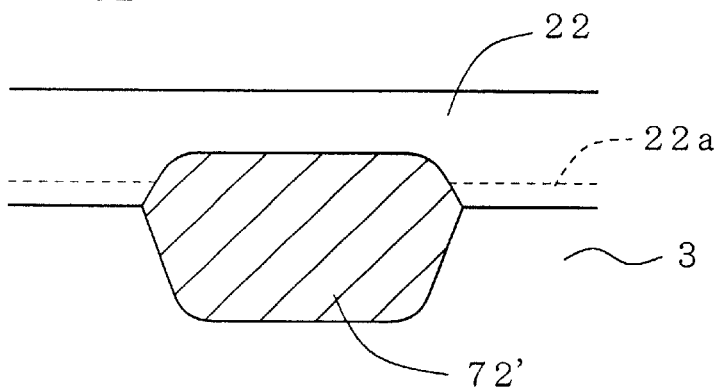

The present inventors found out that the lateral auto-doping of phosphorus can effectively be suppressed if the epitaxial wafer is produced as follows as shown in FIGS. 24A to 24D: that is, ion implantation of phosphorus is performed to thereby form a phosphorus-implanted layer 72 as shown in FIG. 24A; the wafer is then, prior to the vapor-phase growth of a second epitaxial layer, annealed in a hydrogen atmosphere at 950 to 1,100° C. (more preferably 1,060 to 1,100° C.) under the normal pressure to thereby allow a part of phosphorus to diffuse outwardly into the vapor phase and to lower the temperature of the surface of the phosphorus-implanted layer as shown in FIG. 24B; a capping epitaxial layer 22a is formed in vapor phase while supplying a silicon source gas under reduced pressure as shown in FIG. 24C (capping growth step) and on such capping epitaxial layer 22a the second epitaxial layer 22 is formed by the major growth process. When the embodiment according to the first aspect is adopted, continuing the annealing under a hydrogen atmosphere shown in FIG. 2B for 30 minutes allows the crystallinity recovery/activation annealing to be effected at the same time. This corresponds to an embodiment according to the seventh aspect. A dopant gas is not supplied during the vapor-phase growth of the capping epitaxial layer 22a. The thickness of the capping epitaxial layer 22a is preferably within a range from 0.2 to 1 μm, where the thickness exceeding 1 μm will undesirably cause an abrupt change in the net carrier concentration at the interface with the second epitaxial layer 22, whereas the thickness smaller than 0.2 μm result in poor capping effect.

The capping growth step is preferably proceeded under a pressure of 5 to 60 Torr. The pressure lower than 5 Torr will lower the productivity due to a slow vapor-phase growth speed, and the pressure exceeding 60 Torr will result in insufficient effect of suppressing the lateral auto-doping of phosphorus.

After the capping growth process is completed, the major growth process can be proceeded in the same vapor-phase growth apparatus under high temperature and/or high pressure conditions, which ensures a higher productivity than in the capping growth step, since the wafer is fully protected from the auto-doping.

Experiments described below were conducted in order to confirm the effect of the third aspect. A silicon single-crystalline substrate employed has a diameter of 200 mm, an [100] crystal axis orientation (no off-angle), a conductivity type of n⁺ (resistivity; 0.010 to 0.015 Ω·cm), and has on the backside thereof an oxide film of 0.5 μm thick for preventing the auto-doping. On the major front surface thereof, a p⁻-type first epitaxial layer (net carrier concentration: $3\times10^{15}$ atoms/cm³) of 10 μm thick was then formed using trichlorosilane as a silicon source gas and hydrogen-diluted diborane ($B_2H_6$) as a dopant gas at a vapor-phase growth temperature of 1,130° C. under the normal pressure. To such first epitaxial layer, a plurality of phosphorus-implanted layers individually having a rectangular form of 1,730 μm long and 8 μm wide, and aligned in the direction of width at approx. 16 μm intervals, were formed by ion implantation. The pre-implantation oxidation was performed herein so as to form an oxide film of approx. 50 nm thick, so that the ion implantation was effected through such oxide film at an ion acceleration voltage of 120 to 150 keV, and an amount of dose of $2\times10^{12}$/cm². The wafer was then subjected to the annealing for crystallinity recovery and carrier activation in a nitrogen atmosphere at 950° C. for 30 minutes.

After the oxide film formed by the pre-implantation oxidation was removed by wet etching, the wafer was then placed in the reaction unit 122 of the vapor-phase growth apparatus 121 of such type shown in FIGS. 4A and 4B, and was subjected to the annealing in a hydrogen atmosphere at various temperatures of 900° C., 1,080° C. and 1,190° C. for 10 minutes under the normal pressure (760 Torr). The capping epitaxial layer of 0.5 μm thick was then grown thereon using a source gas same as that used for forming the first epitaxial layer, while a dopant gas not being supplied, at 850° C. under 25 Torr. In succession, the main growth was conducted at 1,080° C. under 80 Torr while additionally supplying diborane ($B_2H_6$) as a dopant gas to thereby form the second epitaxial layer of 10 μm thick (net carrier concentration: $3\times10^{15}$ atoms/cm³).

Figure 26:
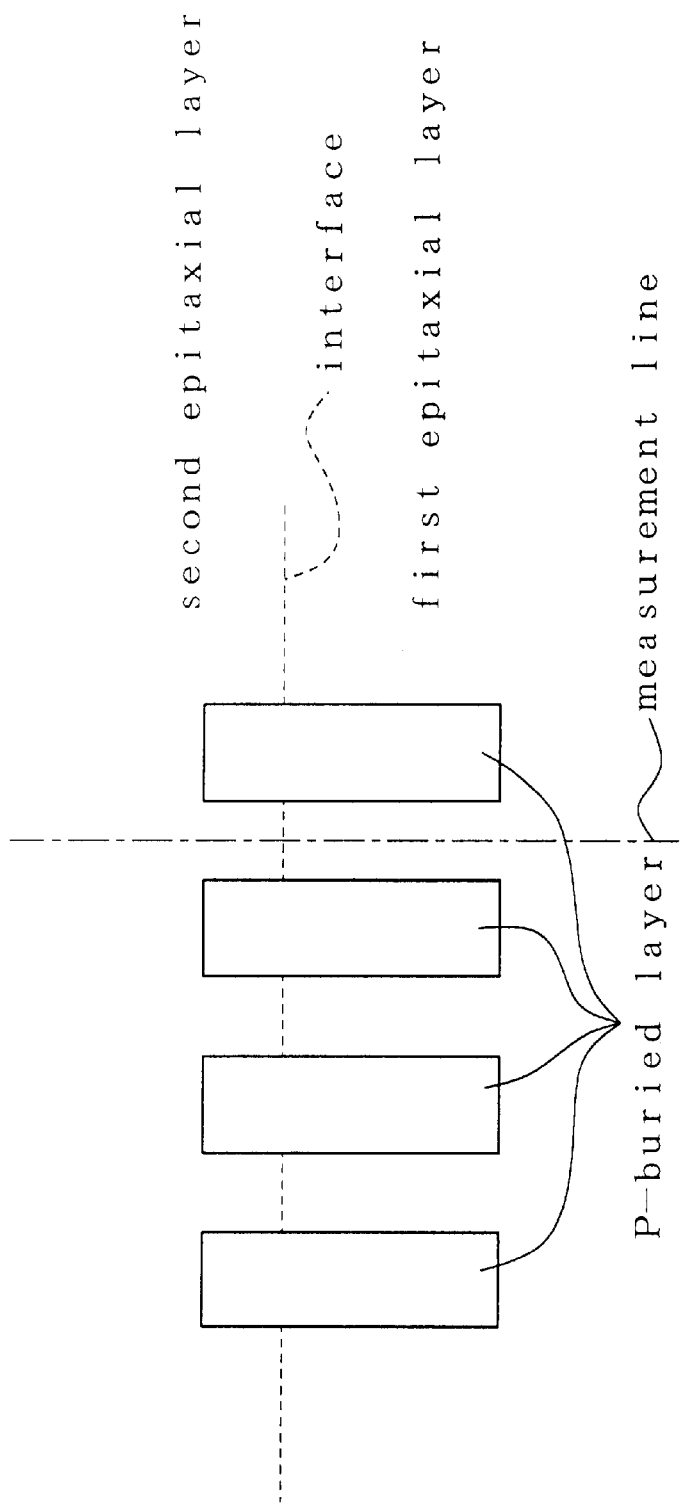
FIG. 26 is a view explaining a setting mode of a measurement line for carrier concentration profile in a confirmative experiment for the third aspect.

The thus-obtained epitaxial wafer having the phosphorus-buried layers buried therein was then polished by angled polishing at 1 degree away from the major surface so as to expose a plurality of such phosphorus-buried layers being laterally aligned. On such polished surface, a measurement line was set between each adjacent phosphorus-buried layers (i.e., at apposition not crossing the phosphorus-buried layer) in the direction normal to the interface between the epitaxial layers as shown in FIG. 26, and a net carrier concentration profile in the epitaxial layer was measures by the spreading resistance method. In such measurement profile, a value of $(A_H-B_H)/A_H$ was calculated for each wafer, where $B_H$ represents a lowest value for the net carrier concentration at the interface between the epitaxial layers, and $A_H$ represents an average net carrier concentration in a region of the epitaxial layer having a most stable carrier concentration. A smaller value of $(A_H-B_H)/A_H$ means a smaller lateral auto-doping of phosphorus at the interface between the epitaxial layers. Results of the measurements were shown in Table 1.

TABLE 1

| Temperature of annealing under normal pressure (° C.) | $(A_H-B_H)/A_H$ |
|---|---|
| 900 | 0.72 |
| 1,080 | 0.47 |
| 1,190 | 0.99 |

Figure 27A:
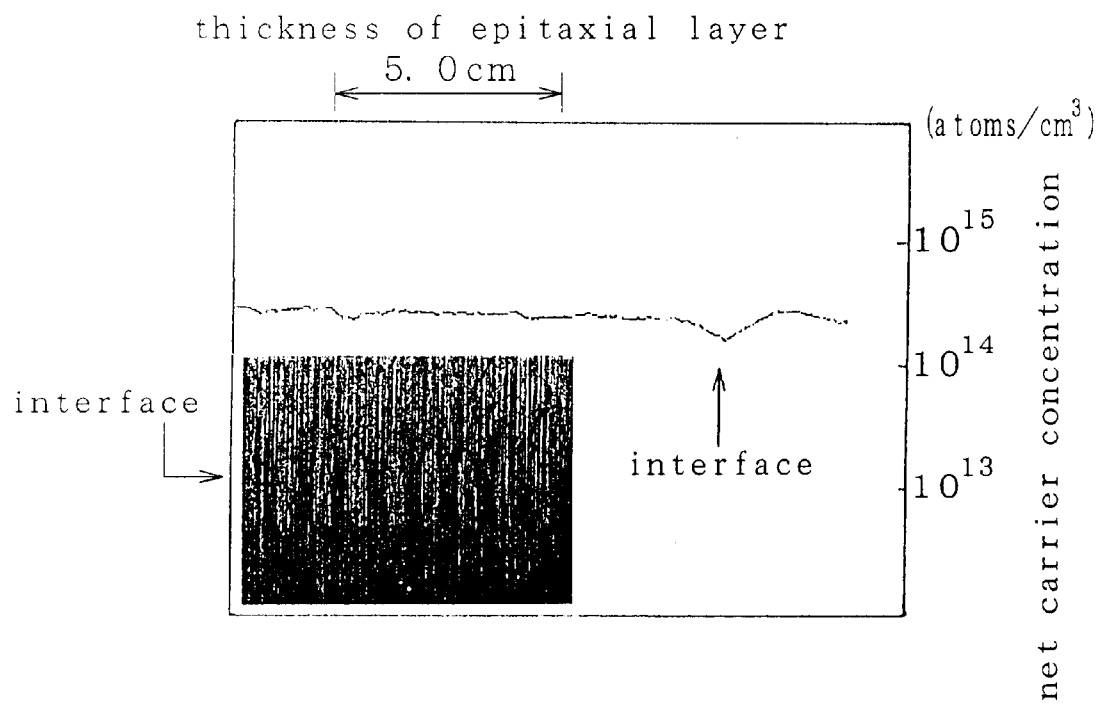
FIGS. 27A and 27B are charts showing exemplary measurements of such carrier concentration profiles.
Figure 27B:
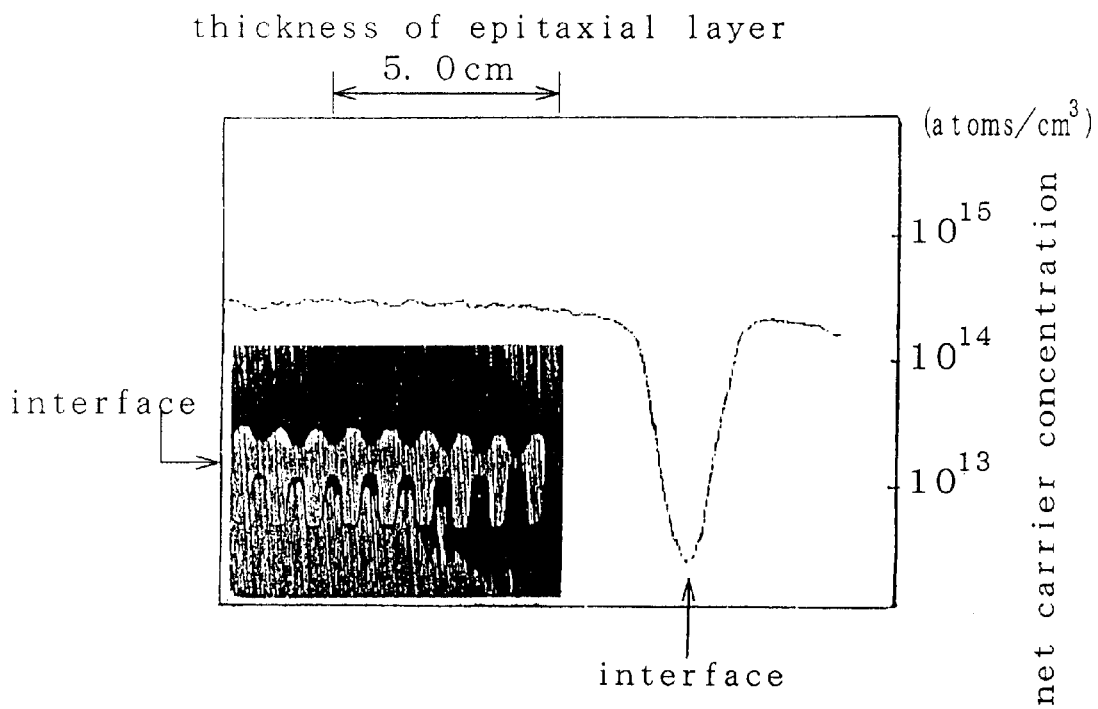

It was found that only the wafer annealed at 1,080° C. in the annealing under the normal pressure before the capping epitaxial layer is formed was successful in suppressing the value of $(A_H-B_H)/A_H$ below 0.5, which means the lateral auto-doping of phosphorus can effectively be suppressed by the annealing at 1,080° C. or around under the normal pressure. FIGS. 27A and 27B shows charts showing results of exemplary measurements of such carrier concentration profiles obtained by the spreading resistance method, where FIG. 27A corresponds to a temperature of annealing under the normal pressure of 1,080° C., and FIG. 27B of 1,190° C. It is known from the results that no significant decrease in the carrier concentration at the interface occurs in the case shown in FIG. 27A, whereas a sharp decrease in the carrier concentration is observed in the case shown in FIG. 27B which is ascribable to the lateral auto-doping of phosphorus into the p-type epitaxial layer. These figures also include photographs showing an enlarged view of the sample surface on which the carrier concentration was measured, which are taken after the sample was immersed into a staining solution comprising a hydrofluoric acid-nitric acid aqueous solution and then subjected to light exposure. The dark background portion corresponds to the p-type epitaxial layer, and bright portions appear in such background corresponds to the n-type phosphorus-buried layer. FIG. 27A shows no interconnection between the adjacent phosphorus-buried layers, whereas FIG. 27B shows interconnection of the phosphorus-buried layers at the interface due to the lateral auto-doping of phosphorus.

(Embodiment 5)

An embodiment according to the fourth aspect will be described. An essence of this aspect resides in that, for the case both of the boron-buried layer and the phosphorus-buried layer are formed in the first epitaxial layer, the pre-implantation oxidation for oxidizing the surface of such first epitaxial layer is not performed after the phosphorus-buried layer is formed, in other words, that the phosphorus implantation step is provided after the boron implantation step. Such process has already been described in the foregoing Referential Technical Example 1 referring to FIGS. 14A to 17.

Figure 15H:
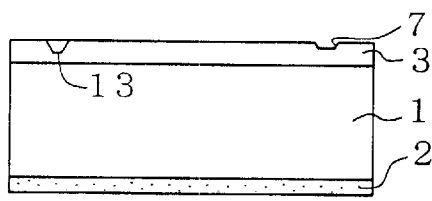
Figure 15I:
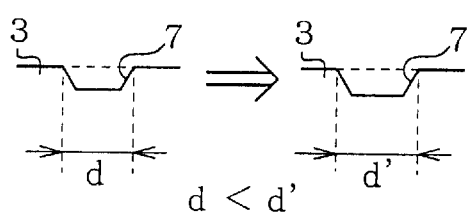

That is, the boron-implanted layer 13 is formed as shown in FIG. 15H, and the ion implantation mask oxide film 15 is formed so as to cover the boron-implanted layer 13 (FIG. 16C). Since boron is likely to be incorporated into the oxide film, the boron-implanted layer 13 having the oxide film 15 formed thereon causes decrease in the surface concentration rather than causing the densification at the surface portion thereof, which allows the auto-doping to be suppressed. On the other hand, phosphorus intrinsically has a tendency of being accumulated at the interface, with the oxide layer. Phosphorus in this process is, however, implanted after the oxide film 19 is formed by the pre-implantation oxidation as shown in FIG. 16C, so that the densification of phosphorus at the surface portion of the phosphorus-implanted layer 20 is avoidable. Thus the lateral auto-doping of boron and phosphorus can effectively be suppressed even after the second epitaxial layer 22 is formed. Prolonged annealing with the oxide film 15 remained thereon after the phosphorus implantation, however, promotes the densification of phosphorus at the surface portion of the phosphorus-implanted layer 20, so that it is preferable to immediately grow the second epitaxial layer 22 while skipping the crystallinity recovery annealing.

Figure 25A:
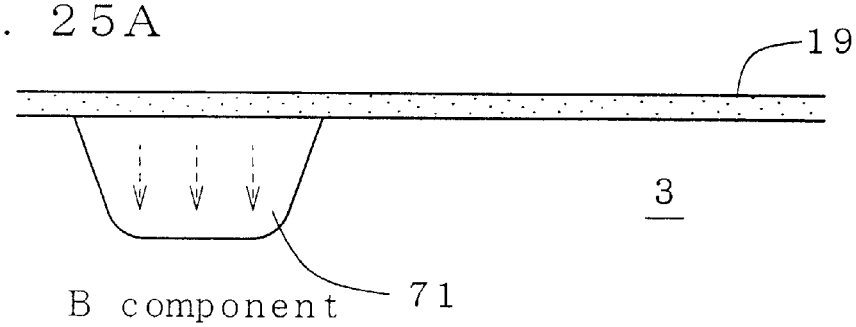
FIGS. 25A to 25D are views explaining essential part of process steps in a production method modified from the fourth aspect.
Figure 25B:
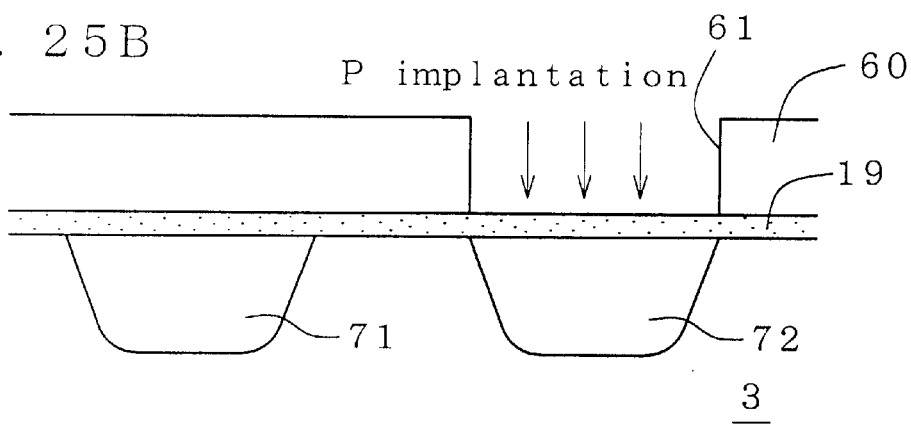
Figure 25C:
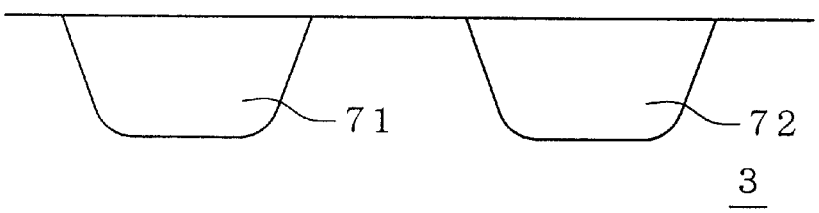
Figure 25D:
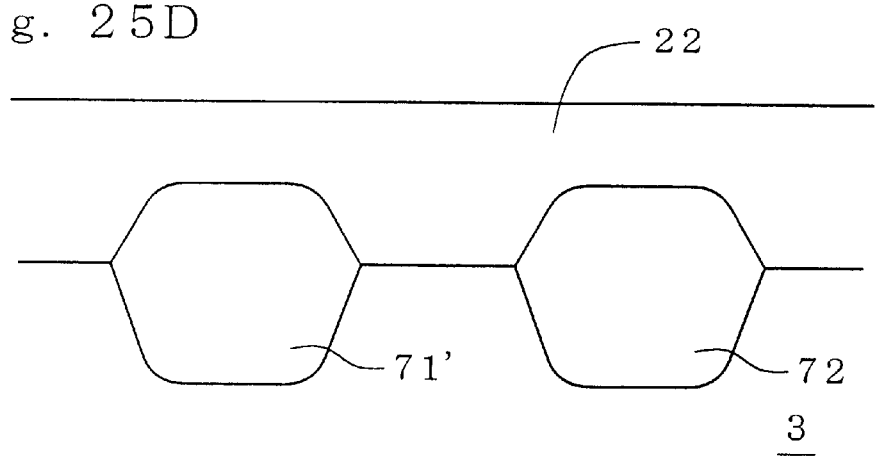

The foregoing fourth aspect is also applicable to a method for producing an epitaxial wafer in which a photoresist film is used as an ion implantation mask. In this case, the boron-implanted layer 71 is formed in advance in the first epitaxial layer 3 and then the oxide film 19 is formed by the pre-implantation oxidation as shown in FIG. 25A. Boron in the boron-implanted layer 71 is less collective at the interface with the pre-implantation oxide film 19 based on the reason described in the above, and therefore is not densified at the surface portion. The ion implantation mask 60 for use in the phosphorus implantation is formed using a resist film, and phosphorus is implanted as shown in FIG. 25B. The ion implantation mask 60 and the pre-implantation oxide film 19 are then removed as shown in FIG. 25C, and further thereon the second epitaxial layer 22 is grown to thereby obtain the boron-buried layer 71' and the phosphorus-buried layer 72' as shown in FIG. 25D.

What is claimed is:

1. A method for producing a silicon epitaxial wafer in which an impurity element is introduced by ion implantation to a first epitaxial layer to form an ion-implanted layer, and a second epitaxial layer is stacked thereon by vapor-phase growth to thereby produce a structure having said ion-implanted layer as being buried as a buried layer between said first epitaxial layer and said second epitaxial layer, comprising:

a mask formation step for forming an ion implantation mask made of a photoresist film directly on the surface of said first epitaxial layer;

an ion implantation step for implanting said ion into said first epitaxial layer having said ion implantation mask formed thereon;

a hydrogen annealing step provided after said ion implantation step and before the vapor-phase growth of said second epitaxial layer; and a vapor-phase growth step for growing in vapor phase said second epitaxial layer after said hydrogen annealing step.

2. The method for producing a silicon epitaxial wafer in accordance with claim 1, wherein said hydrogen annealing step is responsible for recovering crystal damage generated in said ion-implanted layer during said ion implantation step, and for activating carriers.

3. The method for producing a silicon epitaxial wafer in accordance with claim 1, wherein said hydrogen annealing step is proceeded at an annealing temperature ranging from 950 to 1,150° C.

4. The method for producing a silicon epitaxial wafer in accordance with claim 1, wherein said hydrogen annealing step is proceeded in a hydrogen atmosphere under the normal pressure.

5. The method for producing a silicon epitaxial wafer in accordance with claim 1, wherein said hydrogen annealing step is proceeded by introducing hydrogen gas into a vapor-phase growth apparatus immediately before said second epitaxial layer is grown in vapor phase in such vapor-phase growth apparatus.

6. A method for producing a silicon epitaxial wafer comprising:

a first mask formation step for forming a first ion implantation mask, which is for use in ion implantation of a first impurity in a first region on the surface of a first epitaxial layer, directly on the surface of such first epitaxial layer using a photoresist film;

a first ion implantation step for implanting ion of said first impurity into said first epitaxial layer having said first ion implantation mask formed thereon, to thereby form a first ion-implanted layer at the position corresponded to said first region;

a second mask formation step for forming a second ion implantation mask, which is for use in ion implantation of a second impurity which differs from said first impurity in a second region which differs from said first region on the surface of a first epitaxial layer, directly on the surface of such first epitaxial layer using a photoresist film;

a second ion implantation step for implanting ion of said second impurity into said first epitaxial layer having said second ion implantation mask formed thereon, to thereby form a second ion-implanted layer at the position corresponded to said second region;

a hydrogen annealing step provided after said second ion implantation step and before vapor-phase growth of a second epitaxial layer on said first epitaxial layer having said first and second ion-implanted layers formed therein; and a vapor-phase growth step for growing in vapor phase said second epitaxial layer after said hydrogen annealing step, to thereby convert said first ion-implanted layer and said second ion-implanted layer into a first buried layer and a second buried layer, respectively.

7. The method for producing a silicon epitaxial wafer in accordance with claim 6, wherein said hydrogen annealing step is responsible for recovering crystal damage generated in said first ion-implanted layer and said second ion-implanted layer during the ion implantation en bloc, and for activating carriers.

8. The method for producing a silicon epitaxial wafer in accordance with claim 6, wherein a process cycle comprising said mask formation steps, said ion implantation steps, said hydrogen annealing step and said vapor-phase growth step is repeated one more time or a plural times, while assuming said second epitaxial layer as a new first epitaxial layer, to thereby form a plurality of epitaxial layers stacked with each other while being respectively interposed with said buried layer.

9. The method for producing a silicon epitaxial wafer in accordance with claim 8, wherein all of a plurality of said buried layers having the same impurity ion implanted therein are separated from each other in the stacking direction of said epitaxial layers.

10. A method for producing a silicon epitaxial wafer in which phosphorous is introduced by ion implantation to a first epitaxial layer to form a phosphorus-implanted layer, and a second epitaxial layer is stacked thereon by vapor-phase growth to thereby produce a structure having said phosphorus-implanted layer as being buried as a buried layer between said first epitaxial layer and said second epitaxial layer, comprising:

an ion implantation step for implanting phosphorus ion into said first epitaxial layer;

an annealing step provided after said ion implantation step and before the vapor-phase growth of said second epitaxial layer, which is proceeded at an annealing temperature ranging from 950 to 1,100° C. under the normal pressure;

a capping growth step, provided after said annealing step, for growing in vapor phase a capping epitaxial layer by introducing a silicon source gas under reduced pressure; and a main growth step for growing in vapor phase said second epitaxial layer on said capping epitaxial layer.

11. The method for producing a silicon epitaxial wafer in accordance with claim 10, wherein said silicon source gas is hydrogen-diluted dichlorosilane, trichlorosilane or silicon tetrachloride.

12. The method for producing a silicon epitaxial wafer in accordance with claim 10, wherein said capping growth step is proceeded under a pressure of 5 to 60 Torr and at a growth temperature of 800 to 950° C.

13. The method for producing a silicon epitaxial wafer in accordance with claim 10, wherein said capping epitaxial layer is formed to have a thickness of 0.2 to 1 µm.

14. The method for producing a silicon epitaxial wafer in accordance with claim 10, wherein said main growth step is proceeded as continued from said capping growth step in the same vapor-phase growth apparatus at a higher temperature and/or under a higher pressure than those in such capping growth step.

15. A method for producing a silicon epitaxial wafer having a structure in which a plurality of epitaxial layers, individually having an ion-implanted layer of the same conductivity type buried in the same region are stacked, wherein said ion-implanted layers are formed so that a lower one has a higher concentration of the implanted impurity.

16. The method for producing a silicon epitaxial wafer in accordance with claim 15, wherein the ion implantation for forming said ion-implanted layers is performed so that the layer in a lower position will have a larger dosage.

17. The method for producing a silicon epitaxial wafer in accordance with claim 15, wherein the ion-implanted layers are formed so that the layer in a lower position will have a smaller pattern area.

18. A silicon epitaxial wafer for fabricating therein a device having a structure in which a plurality of impurity-doped regions are interconnected in the stacking direction of a plurality of epitaxial layers, wherein a plurality of said epitaxial layers individually have an ion-implanted layer of the same conductivity type buried in the same region, and said ion-implanted layers are formed so that the layer in a lower position will have a higher concentration of the implanted impurity.

19. The silicon epitaxial wafer in accordance with claim 18, wherein the ion-implanted layers are formed so that the layer in a lower position will have a smaller pattern area.

20. A method for producing a silicon epitaxial wafer in which a plurality of epitaxial layers are stacked, while being individually interposed with an ion-implanted layer as a buried layer, by repeating a set of process steps comprising:

a first vapor-phase growth step for growing in vapor phase a first epitaxial layer on a silicon single-crystalline substrate having a major front surface of (100) crystal orientation;

a first mask formation step for forming a first ion implantation mask, which is for use in ion implantation of a first impurity in a first region on the surface of said first epitaxial layer, directly on the surface of such first epitaxial layer using a photoresist film;

a first ion implantation step for implanting ion of said first impurity into said first epitaxial layer having said first ion implantation mask formed thereon, to thereby form a first ion-implanted layer at the position corresponded to said first region;

a second mask formation step for forming a second ion implantation mask, which is for use in ion implantation of a second impurity which differs from said first impurity in a second region which differs from said first region on the surface of a first epitaxial layer, directly on the surface of such first epitaxial layer using a photoresist film;

a second ion implantation step for implanting ion of said second impurity into said first epitaxial layer having said second ion implantation mask formed thereon, to thereby form a second ion-implanted layer at the position corresponded to said second region;

a hydrogen annealing step provided after said second ion implantation step, which is proceeded at an annealing temperature ranging from 950 to 1,100° C. under the normal pressure; and a capping growth step, provided after said hydrogen annealing step, for growing in vapor phase a capping epitaxial layer under reduced pressure as a lot, stackingly forming several epitaxial layers, by the repetition of two or more groups of those steps, in the form by which ion-implantation layers are sandwiched as buried layers between layers.

21. The method for producing a silicon epitaxial wafer in accordance with claim 20, wherein the ion-implanted layers are formed so that the layer in a lower position will have a higher dosage and a smaller pattern area.

22. The method for producing a silicon epitaxial wafer in accordance with claim 16, wherein the ion-implanted layers are formed so that the layer in a lower position will have a smaller pattern area.

* * * * *